US012642076B2

(12) United States Patent
Yoo et al.

(10) Patent No.: US 12,642,076 B2

(45) Date of Patent: May 26, 2026

(54) INTEGRATED CIRCUIT DEVICE

(71) Applicant: SAMSUNG ELECTRONICS CO., LTD., Suwon-si (KR)

(72) Inventors: Seungyong Yoo, Suwon-si (KR); Eunji Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 362 days.

(21) Appl. No.: 18/351,888

(22) Filed: Jul. 13, 2023

(65) Prior Publication Data

US 2024/0203883 A1 Jun. 20, 2024

(30) Foreign Application Priority Data

Dec. 14, 2022 (KR) ........................ 10-2022-0174954

(51) Int. Cl.
H10W 20/41 (2026.01)
H10W 20/00 (2026.01)
(Continued)

(52) U.S. Cl.
CPC ....... H10W 20/425 (2026.01); H10W 20/035 (2026.01); H10W 20/059 (2026.01);
(Continued)

(58) Field of Classification Search
CPC ......... H01L 23/53238; H01L 21/76804; H01L 21/76832; H01L 21/76846; H01L 21/76882; H01L 23/5226; H01L 23/53295; H01L 21/76867; H01L 21/76868; H01L 21/76849; H01L 23/5283; H01L 23/53233; H01L 21/76834; H01L 23/53223; H01L 23/53266; H10D 84/834; H10W 20/425; H10W 20/035; H10W 20/059; H10W 20/075; H10W 20/082; H10W 20/42;
(Continued)

(56) References Cited

U.S. PATENT DOCUMENTS 9,245,798 B2    1/2016  Emesh et al.
9,892,965 B2    2/2018  Matsumoto
(Continued)

FOREIGN PATENT DOCUMENTS

KR    10-2009-0026495    3/2009
KR    10-1923807         11/2018

*Primary Examiner* — Patricia D Valenzuela

(74) *Attorney, Agent, or Firm* — Morgan, Lewis & Bockius LLP

(57) ABSTRACT

An integrated circuit device includes an insulating structure above a substrate, and an interconnection structure penetrating the insulating structure in a first direction and including a first local protrusion portion. The first local protrusion portion protrudes outward in a second direction perpendicular to the first direction from a position adjacent to a lower surface of the insulating structure. The interconnection structure further includes a metal plug including a first metal, and a plurality of metal-containing particles including a second metal that is different from the first metal. The plurality of metal-containing particles are irregularly dispersed in a lower plug region of the metal plug, and the lower plug region is spaced apart from an upper surface of the metal plug and includes the first local protrusion portion.

20 Claims, 24 Drawing Sheets

(51) Int. Cl.
    *H10W 20/42*       (2026.01)
    *H10W 20/47*       (2026.01)

(52) U.S. Cl.
    CPC ....... *H10W 20/075* (2026.01); *H10W 20/082*
            (2026.01); *H10W 20/42* (2026.01); *H10W*
                              *20/47* (2026.01)

(58) Field of Classification Search
    CPC . H10W 20/47; H10W 20/041; H10W 20/435;
                H10W 20/4424; H10W 20/037; H10W
                        20/055; H10W 20/077
    See application file for complete search history.

(56)               References Cited

U.S. PATENT DOCUMENTS

| | | |
|---|---|---|
| 10,529,663 B1 | 1/2020 | Nogami et al. |
| 2014/0183743 A1 | 7/2014 | Matsumoto et al. |
| 2017/0213763 A1* | 7/2017 | Matsumoto ....... H01L 21/76864 |
| 2019/0115297 A1* | 4/2019 | Yang ................. H01L 21/76844 |
| 2021/0320064 A1 | 10/2021 | Parikh et al. |

* cited by examiner

INTEGRATED CIRCUIT DEVICE

CROSS-REFERENCE TO RELATED APPLICATION

This application is based on and claims priority under 35 U.S.C. § 119 to Korean Patent Application No. 10-2022-0174954, filed on Dec. 14, 2022, in the Korean Intellectual Property Office, the disclosure of which is incorporated by reference herein in its entirety.

BACKGROUND

The inventive concept relates to an integrated circuit device, and particularly, to an integrated circuit device including a metal interconnection layer.

Owing to the development of electronics technology, down-scaling of integrated circuit devices has rapidly progressed, and the line widths and pitches of metal interconnection layers of integrated circuit devices have reduced. Therefore, there is a need to improve the lifespan and reliability of integrated circuit devices by minimizing physical damage to a multilayer interconnection structure including metal interconnection layers while suppressing an increase in the resistance and leakage current of the metal interconnection layers and electromigration of metals.

SUMMARY

The inventive concept provides an integrated circuit device improved in lifespan and reliability by minimizing physical damage to a multilayer interconnection structure while suppressing an increase in the resistance and leakage current of metal interconnection layers and electromigration of metals.

According to an aspect of the inventive concept, there is provided an integrated circuit device. The integrated circuit device includes an insulating structure above a substrate, and an interconnection structure penetrating the insulating structure in a first direction and including a first local protrusion portion. The first local protrusion portion protrudes outward in a second direction perpendicular to the first direction from a position adjacent to a lower surface of the insulating structure. The interconnection structure further includes a metal plug including a first metal, and a plurality of metal-containing particles including a second metal that is different from the first metal. The plurality of metal-containing particles are irregularly dispersed in a lower plug region of the metal plug, and the lower plug region is spaced apart from an upper surface of the metal plug and includes the first local protrusion portion.

According to another aspect of the inventive concept, there is provided an integrated circuit device. The integrated circuit device includes an insulating structure and an interconnection structure. The insulating structure includes an interlayer etch stop layer having a multi-layer structure disposed above a substrate and an interlayer insulating layer covering the interlayer etch stop layer. The interconnection structure penetrates the interlayer etch stop layer and the interlayer insulating layer in a vertical direction and including first and second local protrusion portions. The first and second local protrusion portions protrude outward in a horizontal direction from positions adjacent to the interlayer etch stop layer and are spaced apart from each other in the vertical direction. The interconnection structure further includes a metal plug including a first metal, and a plurality of metal-containing particles including a second metal that is different from the first metal and being irregularly dispersed in a lower plug region among lower and upper plug regions of the metal plug. The lower plug region is spaced apart from an upper surface of the metal plug and includes the first and second local protrusion portions. The upper plug region is a remaining region of the metal plug other than the lower plug region.

According to another aspect of the inventive concept, there is provided an integrated circuit device including a lower structure, an interlayer etch stop layer, an interlayer insulating layer, and an interconnection structure. The lower structure is disposed above a substrate. The interlayer etch stop layer is disposed on the lower structure and has a multi-layer structure including at least one aluminum (Al)-containing layer. The interlayer insulating layer covers an upper surface of the interlayer etch stop layer. The interconnection structure includes at least one local protrusion portion that penetrates the interlayer etch stop layer and the interlayer insulating layer in a vertical direction and protrudes outward in a horizontal direction at a position adjacent to the at least one aluminum (Al)-containing layer. The interconnection structure further includes a metal plug including copper (Cu), and a plurality of dispersion particles including manganese (Mn) and irregularly dispersed in only a lower plug region of the metal plug. The lower plug region is spaced apart from an upper surface of the metal plug and includes the at least one local protrusion portion.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1A:
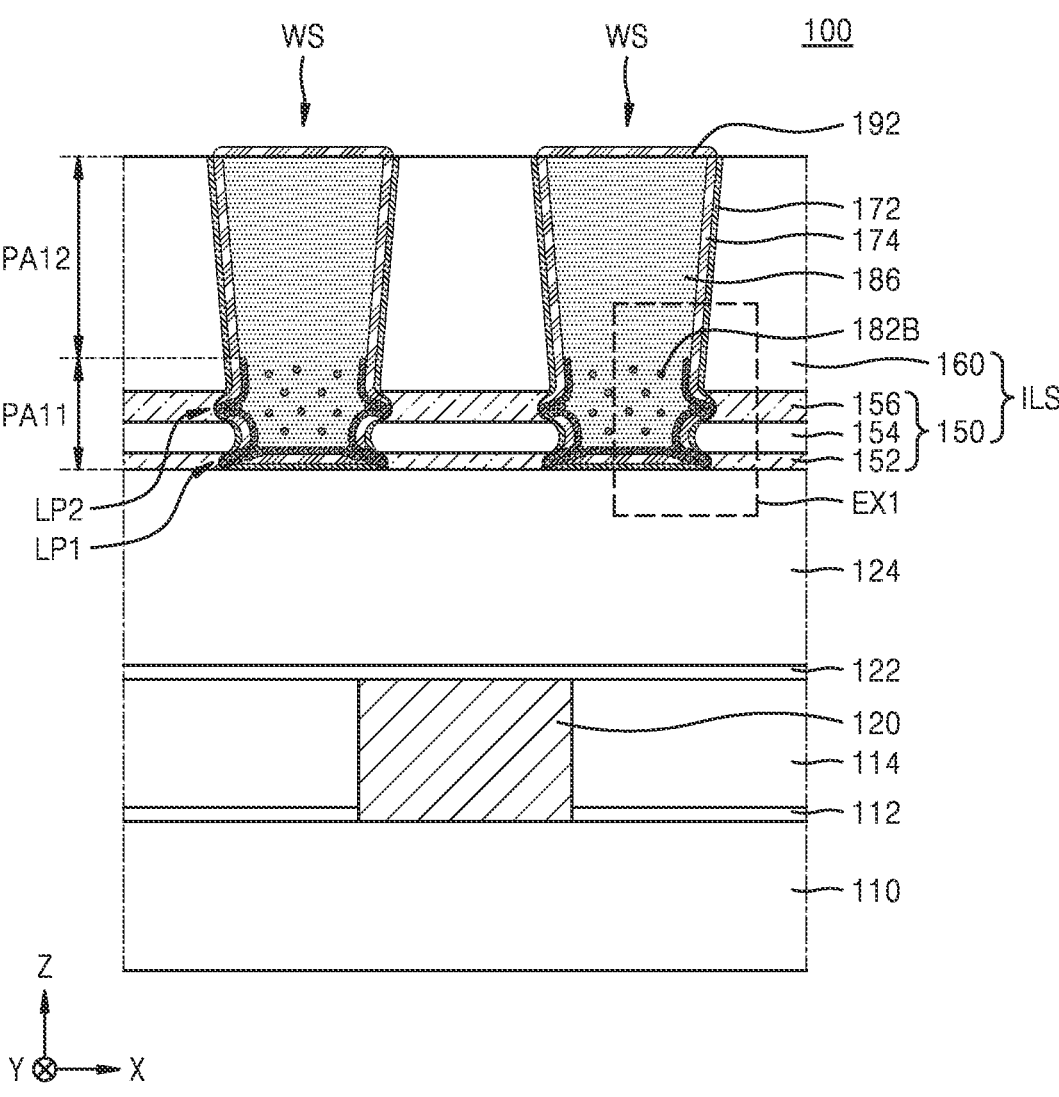
FIG. 1A is a schematic cross-sectional view illustrating an integrated circuit device according to embodiments.

Hereinafter, embodiments will be described with reference to the accompanying drawings. In the drawings, like reference numerals denote like elements, and repeated descriptions thereof are omitted.

Figure 1B:
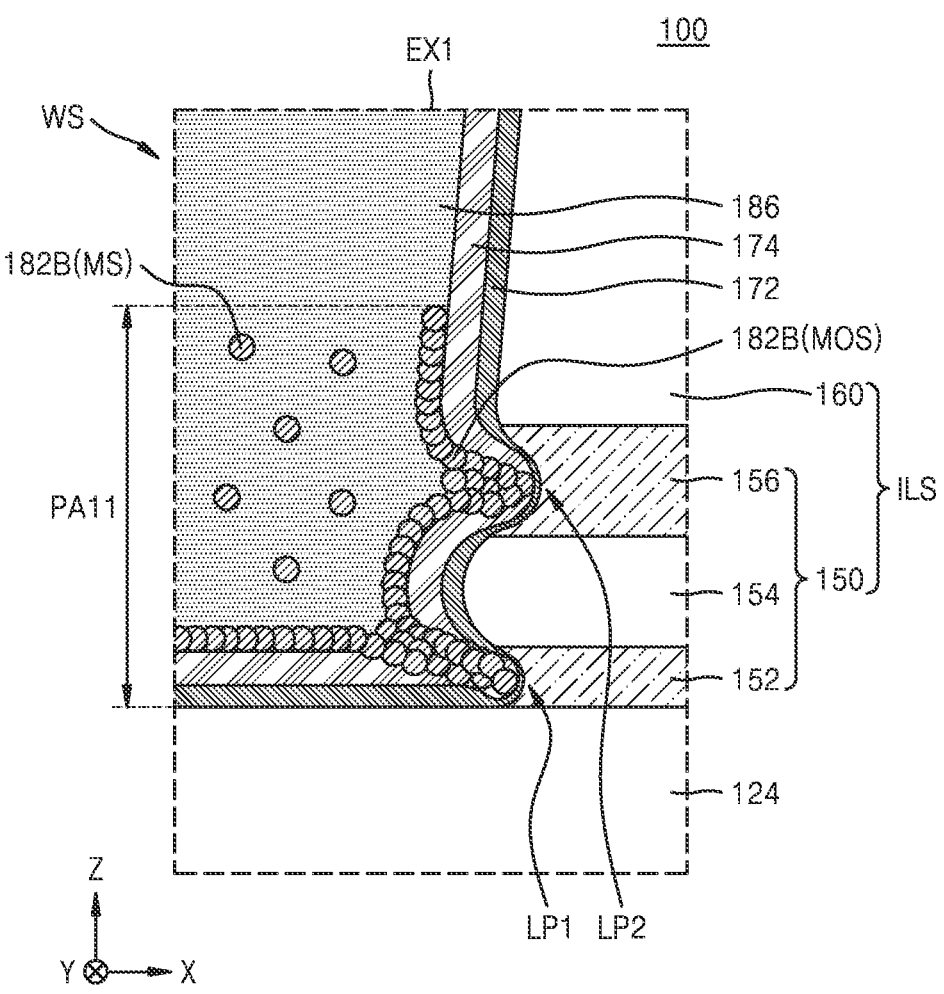
FIG. 1B is an enlarged cross-sectional view of a portion EX1 in FIG. 1A.

FIG. 1A is a schematic cross-sectional view illustrating an integrated circuit device 100 according to embodiments. FIG. 1B is an enlarged cross-sectional view illustrating a portion EX1 in FIG. 1A.

Referring to FIGS. 1A and 1B, the integrated circuit device 100 may include an insulating structure ILS disposed above a substrate 110 and a plurality of interconnection structures WS penetrating the insulating structure ILS in a vertical direction (Z direction).

The substrate 110 may include a semiconductor such as Si or Ge, or a compound semiconductor such as SiGe, SiC, GaAs, InAs, or InP. The substrate 110 may include a conductive region. The conductive region may include a well doped with a dopant, a structure doped with a dopant, or a conductive layer. The substrate 110 may include circuit elements, such as a gate structure, a dopant region, and a contact plug.

A lower etch stop layer 112, a lower insulating layer 114, and a lower conductive layer 120 can be on the substrate 110, where the lower conductive layer 120 may penetrate the lower insulating layer 114 and the lower etch stop layer 112. The lower etch stop layer 112, lower insulating layer 114, and a lower conductive layer 120 can form a lower structure. The lower etch stop layer 112 may include a material having an etch selectivity that is different from the etch selectivity of the lower insulating layer 114. For example, the lower etch stop layer 112 may include a silicon nitride layer, a carbon-doped silicon nitride layer, or a carbon-doped silicon oxynitride layer. In embodiments, the lower etch stop layer 112 may include a metal nitride layer, such as an AlN layer. In embodiments, the lower insulating layer 114 may include a silicon oxide layer. For example, the lower insulating layer 114 may include a silicon oxide-based material such as a plasma-enhanced oxide (PEOX), tetraethyl orthosilicate (TEOS), boro TEOS (BTEOS), phosphorous TEOS (PTEOS), boro phospho TESO (BPTEOS), boro silicate glass (BSG), phospho silicate glass (PSG), or boro phospho silicate glass (BPSG). In embodiments, the lower insulating layer 114 may include a low-k layer having a low dielectric constant K within a range of about 2.2 to about 3.0, for example, a SiOC layer or a SiCOH layer.

The lower conductive layer 120 may be an interconnection layer including a metal layer and a conductive barrier layer surrounding the metal layer. The metal layer may include Cu, W, Al, or Co. The conductive barrier layer may include Ta, TaN, Ti, TiN, or a combination thereof. In embodiments, the lower conductive layer 120 may be electrically connected to the conductive region of the substrate 110. In other embodiments, the lower conductive layer 120 may be connected to a source/drain region or a gate electrode of a transistor formed on the substrate 110.

An intermediate etch stop layer 122 and an intermediate insulating layer 124 may be sequentially disposed on the lower insulating layer 114. Materials of the intermediate etch stop layer 122 and the intermediate insulating layer 124 can be the same materials as the lower etch stop layer 112 and the lower insulating layer 114, respectively.

In the integrated circuit device 100, the insulating structure ILS may include: an interlayer etch stop layer 150 having a multilayer structure sequentially disposed on the intermediate insulating layer 124. An interlayer insulating layer 160 can be on and covering at least a portion of an upper surface of the interlayer etch stop layer 150. The interlayer etch stop layer 150 can be disposed on a lower structure and have a multi-layer structure including at least one aluminum (Al)-containing layer.

The interlayer etch stop layer 150 may include a first aluminum (Al)-containing etch stop layer 152, a SiOC layer 154, and a second aluminum (Al)-containing etch stop layer 156. The SiOC layer 154 may cover an upper surface of the first aluminum (Al)-containing etch stop layer 152, and the second aluminum (Al)-containing etch stop layer 156 may cover an upper surface of the SiOC layer 154.

In embodiments, each of the first aluminum (Al)-containing etch stop layer 152 and the second aluminum (Al)-containing etch stop layer 156 may include an aluminum oxide layer, an aluminum nitride layer, or a combination thereof. For example, each of the first aluminum (Al)-containing etch stop layer 152 and the second aluminum (Al)-containing etch stop layer 156 may include an aluminum oxide layer.

In the vertical direction (Z direction), the first aluminum (Al)-containing etch stop layer 152 and the second aluminum (Al)-containing etch stop layer 156 may have different thicknesses. In embodiments, the thickness of the first aluminum (Al)-containing etch stop layer 152 may be greater than the thickness of the second aluminum (Al)-containing etch stop layer 156 in the vertical direction (Z direction). In other embodiments, the thickness of the first aluminum (Al)-containing etch stop layer 152 may be less than or equal to the thickness of the second aluminum (Al)-containing etch stop layer 156.

The material of the interlayer insulating layer 160 may be the same material as the lower insulating layer 114. For example, the interlayer insulating layer 160 may include a silicon oxide layer.

Each of the interconnection structures WS may penetrate the interlayer etch stop layer 150 and the interlayer insulating layer 160 in the vertical direction (Z direction). Each of the interconnection structures WS may include a first local protrusion portion LP1 and a second local protrusion portion LP2 that are adjacent to a lower surface of the insulating structure ILS and protrude outward from a sidewall of the interconnection structure WS more than other portions of the interconnection structure WS in a horizontal direction (for example, an X direction in FIG. 1A). The first local protrusion portion LP1 and the second local protrusion portion LP2 may be spaced apart from each other in the vertical direction (Z direction), where the first local protrusion portion LP1 can be proximal to the lower surface of the interlayer etch stop layer 150 and the second local protrusion portion LP2 can be proximal to an upper surface of the interlayer etch stop layer 150. The interconnection structure can penetrate the insulating structure in a first (e.g., vertical) direction and include a first local protrusion portion, where the first local protrusion portion protrudes laterally outward in a second (e.g., horizontal) direction perpendicular to the first (e.g., vertical) direction from a position adjacent to a lower surface of the insulating structure.

The first local protrusion portion LP1 of each of the interconnection structures WS may extend laterally outward in the horizontal direction from a position adjacent to the first aluminum (Al)-containing etch stop layer 152 of the interlayer etch stop layer 150 and may be in contact with the first aluminum (Al)-containing etch stop layer 152. The second local protrusion portion LP2 of each of the interconnection structures WS may extend laterally outward in the horizontal direction from a position adjacent to the second aluminum (Al)-containing etch stop layer 156 of the interlayer etch stop layer 150 and may be in contact with the second aluminum (Al)-containing etch stop layer 156.

Each of the interconnection structures WS may include a metal plug 186 and a plurality of metal-containing particles 182B irregularly distributed in the metal plug 186. In embodiments, the metal plug 186 may include copper (Cu), and the metal-containing particles 182B may include manganese (Mn). The plurality of metal-containing particles 182B can include first dispersion particles MOS and second dispersion particles MS, where the first dispersion particles MOS can be located in at least one local protrusion portion.

The metal plug 186 may include: a lower plug region PA11 closer to the substrate 110 in the vertical direction (Z direction) than an upper plug region PA12, and separated from an upper surface of the metal plug 186 in the vertical direction (Z direction) by the upper plug region PA12. The upper plug region PA12 can be a remaining region of the metal plug 186 other than the lower plug region PA11. The lower plug region PA11 may be a region extending from a lower surface of the metal plug 186 to a predetermined height of the metal plug 186 in the vertical direction (Z direction), where the lower plug region PA11 may include the first local protrusion portion LP1 and the second local protrusion portion LP2. The metal-containing particles 182B included in the metal plug 186 may be irregularly dispersed in the lower plug region PA11. Metal-containing particles 182B may be excluded from the upper plug region PA12. In the metal plug 186, for example, the lower plug region PA11 may include a Cu layer in which Mn atoms are dispersed, and the upper plug region PA12 may include a Cu layer including no Mn atoms.

In embodiments, the lower plug region PA11 and the upper plug region PA12 of the metal plug 186 may have various lengths in the vertical direction (Z direction). In an example, the length of the lower plug region PA11 may be less than the length of the upper plug region PA12 in the vertical direction (Z direction). In another example, the length of the lower plug region PA11 may be greater than the length of the upper plug region PA12 in the vertical direction (Z direction). In another example, the length of the lower plug region PA11 and the length of the upper plug region PA12 may be approximately equal to each other in the vertical direction (Z direction), for example, within process control tolerances.

In the lower plug region PA11 of the metal plug 186, the metal-containing particles 182B may be dispersed at a relatively high density in edge portions of the metal plug 186, such as the lower-surface and sidewall portions of the metal plug 186, particularly in portions included in the first local protrusion portion LP1 and the second local protrusion portion LP2. In the lower plug region PA11, the metal-containing particles 182B may be dispersed at a relatively low density in a center portion of the metal plug 186 that is spaced apart from each of the edge portions, including the first local protrusion portion LP1, and the second local protrusion portion LP2 of the metal plug 186.

The upper plug region PA12 of the metal plug 186 that is farther from the substrate 110 than the lower plug region PA11 of the metal plug 186 is from the substrate 110 may not include the metal-containing particles 182B. For example, the upper plug region PA12 may not contain manganese (Mn).

The interlayer insulating layer 160 may include: a portion facing a portion of the lower plug region PA11 at a position farther from the substrate 110 than the second local protrusion portion LP2 is from the substrate 110 in the vertical direction (Z direction), and a portion facing the upper plug region PA12.

The interconnection structures WS may include a first conductive barrier layer 172 and a second conductive barrier layer 174. The first conductive barrier layer 172 may cover a lower surface and a sidewall of the metal plug 186. The second conductive barrier layer 174 may be formed between the lower surface of the metal plug 186 and the first conductive barrier layer 172 and between the sidewall of the metal plug 186 and the first conductive barrier layer 172, and may be in contact with the lower surface and the sidewall of the metal plug 186. The first conductive barrier layer 172 and the second conductive barrier layer 174 can physically separate the metal plug 186 from the interlayer insulating layer 160, where the first conductive barrier layer 172 can provide a diffusion barrier.

The first conductive barrier layer 172 and the second conductive barrier layer 174 may include different metals. In embodiments, the first conductive barrier layer 172 may include a conductive metal nitride. For example, the first conductive barrier layer 172 may include tantalum nitride (TaN), but is not limited thereto. The second conductive barrier layer 174 may include a metal layer. For example, the second conductive barrier layer 174 may include cobalt (Co), but is not limited thereto.

A portion of the first conductive barrier layer 172 that covers the sidewall of the metal plug 186 may have a variable thickness in the vertical direction (Z direction). As illustrated in FIG. 1B, the thicknesses of at least some portions of the first conductive barrier layer 172 formed on the first local protrusion portion LP1 and the second local protrusion portion LP2 may be less than the thickness of a portion of the first conductive barrier layer 172 covering the lower plug region PA11 at a position farther from the substrate 110 than the first local protrusion portion LP1 is from the substrate 110 in the vertical direction (Z direction). In addition, the thickness of at least some portion of the first conductive barrier layer 172 on at least one of the first local protrusion portion LP1 and the second local protrusion portion LP2 may be less than the thickness of a portion of the first conductive barrier layer 172 covering the lower surface of the metal plug 186.

In each of the interconnection structures WS, the metal-containing particles 182B irregularly dispersed in the lower plug region PA11 of the metal plug 186 may include: first dispersion particles MOS that are in the first and second local protrusion portions LP1 and LP2 and regions adjacent to the first and second local protrusion portions LP1 and LP2 and are adjacent to the first and second conductive barrier layers 172 and 174; and second dispersion particles MS that are in the lower plug region PA11 spaced apart from the first and second local protrusion portions LP1 and LP2 and the first and second conductive barrier layers 172 and 174.

In embodiments, the metal-containing particles 182B have relatively high affinity for a metal element included in the second conductive barrier layer 174, for example, cobalt (Co), and thus, most of the metal-containing particles 182B may diffuse into a region adjacent to the second conductive barrier layer 174. As a result, as illustrated in FIGS. 1A and 1B, the number of first dispersion particles MOS located in the first and second local protrusion portions LP1 and LP2, regions adjacent to the first and second local protrusion portions LP1 and LP2, and regions adjacent to the first and second conductive barrier layers 172 and 174 may be greater than the number of second dispersion particles MS located in the lower plug region PA11 of the metal plug 186 spaced apart from the first and second local protrusion portions LP1 and LP2 and the first and second conductive barrier layers 172 and 174. The second dispersion particles MS may be dispersed at a lower density than the first dispersion particles MOS, where the dispersion particles can have a density gradient that increases from the interior of the metal plug 186 towards the second conductive barrier layer 174.

In embodiments, the first dispersion particles MOS may include a metal oxide containing manganese (Mn), for example, manganese oxide, and the second dispersed particles MO may include only manganese (Mn). Oxygen atoms included in the manganese oxide of the first dispersion particles MOS may originate from the interlayer insulating layer 160. The manganese oxide may refer to a substance generated by a reaction between manganese (Mn) atoms and oxygen atoms coming from the interlayer insulating layer 160 or the interlayer etch stop layer 150, or by a reaction between manganese (Mn) atoms, oxygen atoms coming from the interlayer insulating layer 160 or the interlayer etch stop layer 150, and silicon atoms coming from the interlayer insulating layer 160 or the interlayer etch stop layer 150. The manganese can scavenge the oxygen and silicon atoms coming from the interlayer insulating layer 160 and/or the interlayer etch stop layer 150. The first dispersion particles MOS may include various types of materials selected from MnO, $Mn_3O_4$, $Mn_2O_3$, $MnO_2$, $MnSi_xO_y$ (where x and y respectively refer to arbitrary natural numbers), and the like.

For example, the first conductive barrier layer 172 may include a thinner portion on at least one of the first local protrusion portion LP1 and the second local protrusion portion LP2 relative to a portion on the sidewall of the metal plug 186, or may, have a cut (interrupted) portion on at least one of the first local protrusion portion LP1 and the second local protrusion portion LP2. The oxygen atoms or silicon atoms contained in the interlayer insulating layer 160 or the interlayer etch stop layer 150 may unintendedly permeate into the second conductive barrier layer 174 of the interconnection structure WS through the thinner portion or the cut portion of the first conductive barrier layer 172. Even in this case, because the metal-containing particles 182B dispersed in the metal plug 186 have relatively high affinity for a metal element, for example, cobalt (Co), included in the second conductive barrier layer 174, most of the metal-containing particles 182B may diffuse into a region adjacent to the second conductive barrier layer 174, and at least some of the metal-containing particles 182B diffusing into the region adjacent to the second conductive barrier layer 174 may react with the oxygen atoms permeating from the interlayer insulating layer 160 or the interlayer etch top layer 150 through the first conductive barrier layer 172 and the second conductive barrier layer 174 of the interconnection structure WS, forming manganese oxide.

As described above, the first dispersion particles MOS of the metal-containing particles 182B diffusing into the region adjacent to the second conductive barrier layer 174 may reinforce weak portions of the first conductive barrier layer 172 on the first and second local protrusion portions LP1 and LP2, thereby reducing or preventing unintended permeation of external impurities such as oxygen atoms into the interconnection structure WS and protecting portions of the metal plug 186 of the interconnection structure WS, which are relatively vulnerable to attack from the outside due to the first and second local protrusion portions LP1 and LP2. An increased concentration of the metal-containing particles 182B at the first local protrusion portion LP1 and the second local protrusion portion LP2 can compensate for the weak portions of the first conductive barrier layer 172 on the first and second local protrusion portions LP1 and LP2.

As illustrated in FIG. 1A, the upper surface of the metal plug 186 of each of the interconnection structures WS may be covered with a third conductive barrier layer 192. In embodiments, the third conductive barrier layer 192 may include the same material as a material of the second conductive barrier layer 174, where the second conductive barrier layer 174 and the third conductive barrier layer 192 can be contiguous. For example, the third conductive barrier layer 192 may include cobalt (Co). In embodiments, the third conductive barrier layer 192 may include a Co layer or a Co alloy layer. The third conductive barrier layer 192 may be above an upper surface of the interlayer insulating layer 160.

The integrated circuit device 100 illustrated in FIGS. 1A and 1B includes the metal-containing particles 182B irregularly dispersed in the lower plug region PA11 of the metal plug 186 of each of the interconnection structures WS. Among the metal-containing particles 182B, the first dispersion particles MOS diffused into a portion of the lower plug region PA11 adjacent to the second conductive barrier layer 174 may reinforce weak portions of the first conductive barrier layer 172 which are on the first and second local protrusion portions LP1 and LP2, thereby reducing or preventing unintended permeation of external impurities such as oxygen atoms into each of the interconnection structures WS and protecting portions of the metal plug 186 of each of the interconnection structures WS which are relatively vulnerable to attack from the outside due to the first and second local protrusion portions LP1 and LP2. Therefore, in each of the interconnection structures WS, the thickness of a conductive barrier layer that includes a metal nitride layer having higher resistance than a metal layer, for example, the thickness of the first conductive barrier layer 172, may be reduced. As a result, an increase in the resistance and leakage current of each of the interconnection structures WS may be suppressed, and migration of electrons from the metal plugs 186 may be suppressed, thereby improving the reliability of the interconnection structures WS including the metal plugs 186.

Figure 2A:
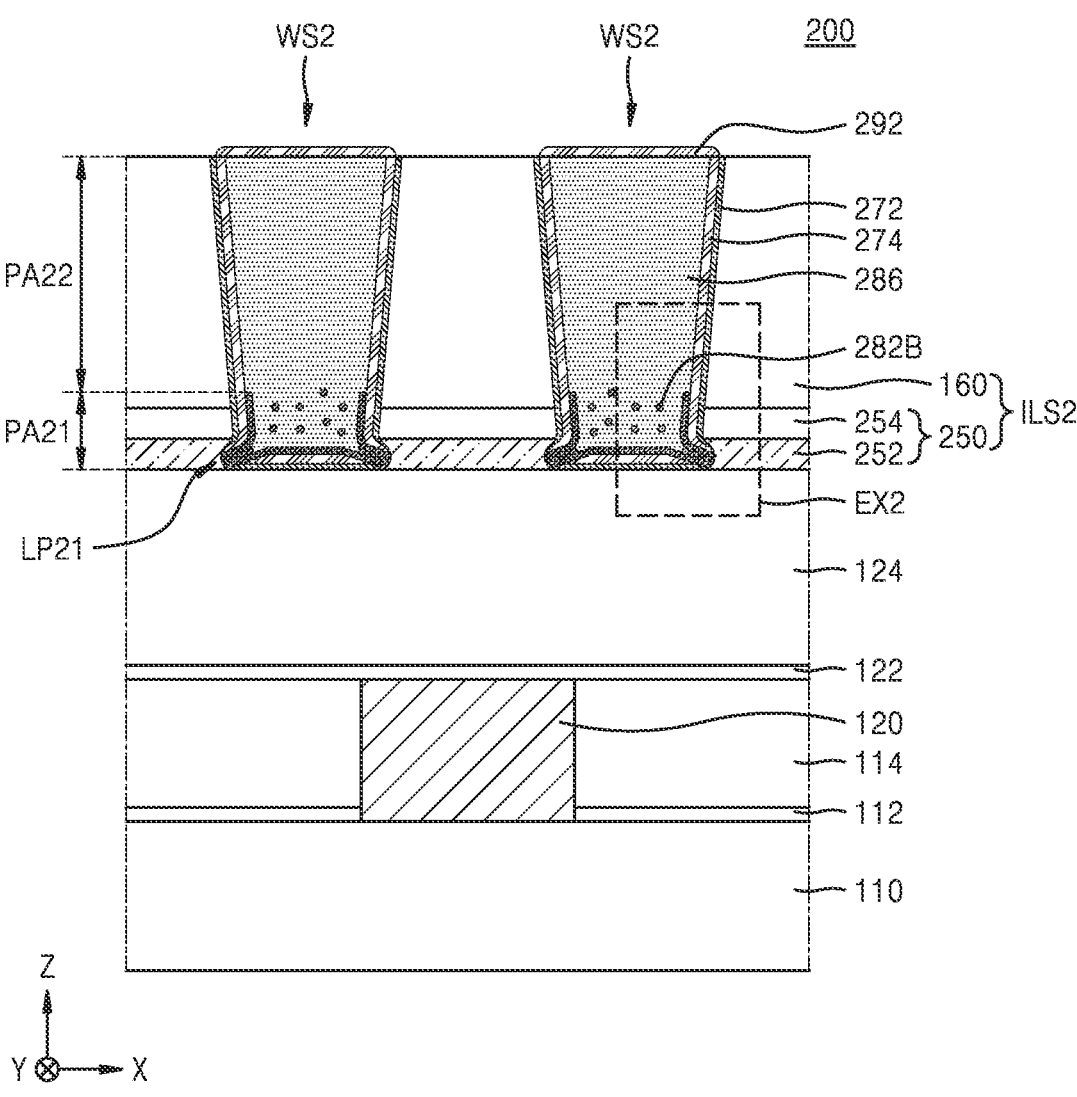
FIG. 2A is a schematic cross-sectional view illustrating an integrated circuit device according to other embodiments.
Figure 2B:
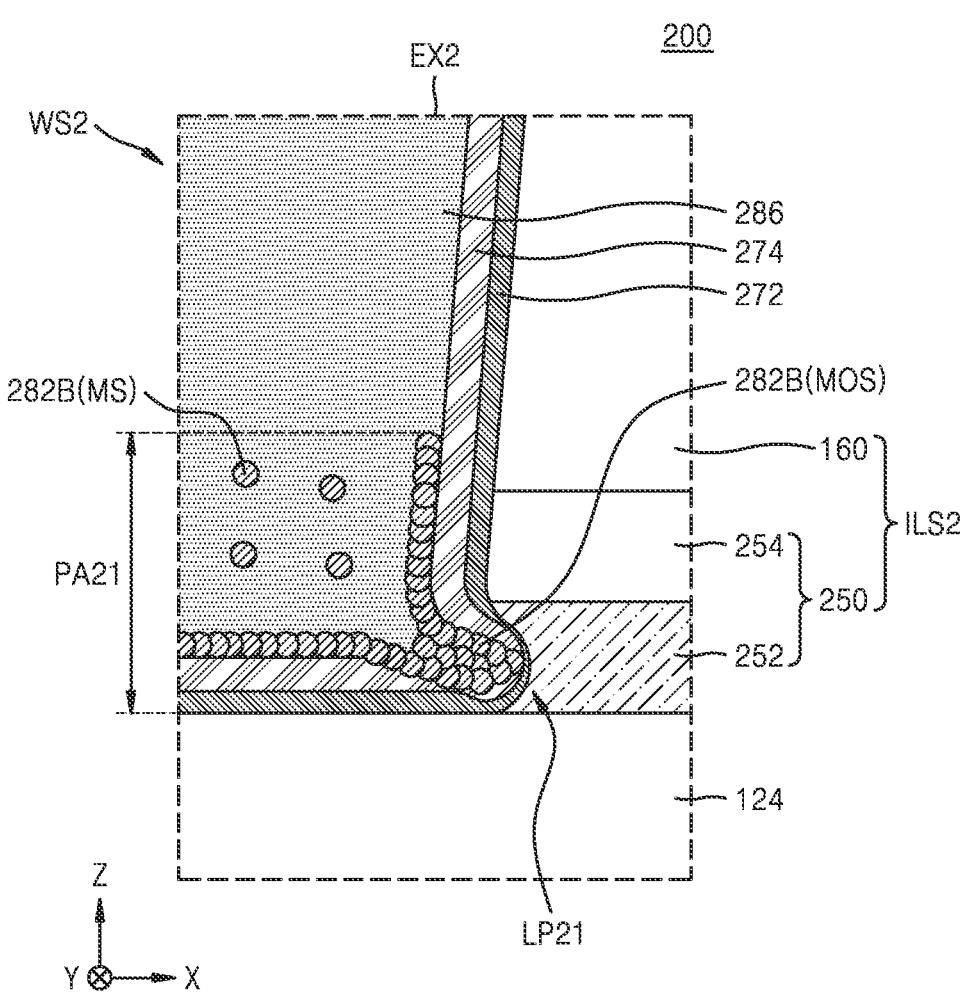
FIG. 2B is an enlarged cross-sectional view illustrating a portion EX2 in FIG. 2A.

FIG. 2A is a schematic cross-sectional view illustrating an integrated circuit device 200 according to other embodiments. FIG. 2B is an enlarged cross-sectional view illustrating a portion EX2 of FIG. 2A. In FIGS. 2A and 2B and FIGS. 1A and 1B, like reference numerals denote like elements, and repeated descriptions thereof are omitted.

Referring to FIGS. 2A and 2B, the integrated circuit device 200 has substantially the same structure as the integrated circuit device 100 described with reference to FIGS. 1A and 1B. The integrated circuit device 200 may include: an insulating structure ILS2 disposed above a substrate 110; and a plurality of interconnection structures WS2 penetrating the insulating structure ILS2 in a vertical direction (Z direction).

The insulating structure ILS2 may have substantially the same structure as the insulating structure ILS described with reference to FIGS. 1A and 1B. However, the insulating structure ILS2 may include: an interlayer etch stop layer 250 having a double-layer structure sequentially disposed on an intermediate insulating layer 124; and an interlayer insulating layer 160 covering an upper surface of the interlayer etch stop layer 250.

The interlayer etch stop layer 250 may include an aluminum (Al)-containing etch stop layer 252 and a SiOC layer 254. The SiOC layer 254 may cover an upper surface of the aluminum (Al)-containing etch stop layer 252. The interlayer insulating layer 160 may cover an upper surface of the SiOC layer 254. In embodiments, the aluminum (Al)-containing etch stop layer 252 may include an aluminum oxide layer, an aluminum nitride layer, or a combination thereof. For example, the aluminum (Al)-containing etch stop layer 252 may include an aluminum nitride layer.

Each of the interconnection structures WS2 may penetrate the interlayer etch stop layer 250 and the interlayer insulating layer 160 in the vertical direction (Z direction). The interconnection structures WS2 may include a local protrusion portion LP21 adjacent to a lower surface of the insulating structure ILS2 and protrude outward more than other portions of the interconnection structure WS2 in a horizontal direction (for example, an X direction in FIG. 2A). The local protrusion portion LP21 may further protrude outward in the horizontal direction at a position adjacent to the aluminum (Al)-containing etch stop layer 252 of the interlayer etch stop layer 250, and may be in contact with the aluminum (Al)-containing etch stop layer 252.

Each of the interconnection structures WS2 may include a metal plug 286 and a plurality of metal-containing particles 282B irregularly dispersed in the metal plug 286.

The metal plug 286 may include copper (Cu), and the metal-containing particles 282B may include manganese (Mn). The metal plug 186 may include: a lower plug region PA21 closer to the substrate 110 in the vertical direction (Z direction) than an upper plug region PA22, and separated from an upper surface of the metal plug 286 in the vertical direction (Z direction) by the upper plug region PA12. An upper plug region PA22 can be a remaining region of the metal plug 286 other than the lower plug region PA21. The lower plug region PA21 may be a region extending from a lower surface of the metal plug 286 to a predetermined height of the metal plug 186 in the vertical direction (Z direction), where the lower plug region PA21 may include the local protrusion portion LP21. The metal-containing particles 282B included in the metal plug 286 may be irregularly dispersed in the lower plug region PA21. Metal-containing particles 282B may be excluded from the upper plug region PA22. In the metal plug 286, for example, the lower plug region PA21 may include a Cu layer in which Mn atoms are dispersed, and the upper plug region PA22 may include a Cu layer including no Mn atoms.

In embodiments, the lower plug region PA21 and the upper plug region PA22 of the metal plug 286 may have various lengths in the vertical direction (Z direction). In an example, the length of the lower plug region PA21 may be less than the length of the upper plug region PA22 in the vertical direction (Z direction). In another example, the length of the lower plug region PA21 may be greater than the length of the upper plug region PA22 in the vertical direction (Z direction). In another example, the length of the lower plug region PA21 and the length of the upper plug region PA22 may be approximately equal to each other in the vertical direction (Z direction), for example, within process control tolerances.

The upper plug region PA22 of the metal plug 286 that is farther from the substrate 110 than the lower plug region PA21 of the metal plug 286 is from the substrate 110 may not include the metal-containing particles 282B. The upper plug region PA22 may not contain manganese (Mn). The metal plug 286 and the metal-containing particles 282B respectively have the same structures as the metal plug 186 and the metal-containing particles 182B described with reference to FIGS. 1A and 1B.

Each of the interconnection structures WS2 may include a first conductive barrier layer 272 and a second conductive barrier layer 274. A portion of the first conductive barrier layer 272 covering a sidewall of the metal plug 286 may have a variable thickness in the vertical direction (Z direction). As illustrated in FIG. 2B, the thicknesses of at least a portion of the first conductive barrier layer 272 formed on the local protrusion portion LP21 may be less than the thickness of a portion of the first conductive barrier layer 272 covering the lower plug region PA21 at a position farther from the substrate 110 than the local protrusion portion LP21 is from the substrate 110 in the vertical direction (Z direction). In addition, the thickness of at least a portion of the first conductive barrier layer 272 on the local protrusion portion LP21 be less than the thickness of a portion of the first conductive barrier layer 272 covering the lower surface of the metal plug 286. The first conductive barrier layer 272 and the second conductive barrier layer 274 respectively have substantially the same structures as the first conductive barrier layer 172 and the second conductive barrier layer 174 described with reference to FIGS. 1A and 1B.

In each of the interconnection structures WS2, the metal-containing particles 282B irregularly dispersed in the lower plug region PA21 of the metal plug 286 may include: first dispersion particles MOS that are in the local protrusion portion LP21 and a region adjacent to the local protrusion portion LP21, and are adjacent to the first and second conductive barrier layers 272 and 274; and second dispersion particles MS that are dispersed in the lower plug region PA21 spaced apart from the local protrusion portion LP21 and the first and second conductive barrier layers 272 and 274.

Like the metal-containing particles 182B described with reference to FIGS. 1A and 1B, most of the metal-containing particles 282B may diffuse into a region adjacent to the second conductive barrier layer 274. As a result, as illustrated in FIGS. 2A and 2B, the number of first dispersion particles MOS located in the local protrusion portion LP21, regions adjacent to the local protrusion portion LP21, and regions adjacent to the first and second conductive barrier layers 272 and 274 may be greater than the number of second dispersion particles MS located in the lower plug region PA21 of the metal plug 286 spaced apart from the local protrusion portion LP21 and the first and second conductive barrier layers 272 and 274.

At least some of the first dispersion particles MOS diffused into a region adjacent to the second conductive barrier layer 274 among the metal-containing particles 282B may react with oxygen atoms permeating from the interlayer insulating layer 160 through the first conductive barrier layer 272 and the second conductive barrier layer 274 of the interconnection structure WS2, forming manganese oxide.

In this manner, among the metal-containing particles 282B, the first dispersion particles MOS diffused into a region adjacent to the second conductive barrier layer 274 may reinforce a weak portion of the first conductive barrier layer 272 which is on the local protrusion portion LP21, thereby protecting a portion of the metal plug 286 of each of the interconnection structures WS2 which is relatively vulnerable to attack from the outside due to the local protrusion portion LP21. An increased concentration of the metal-containing particles 282B at the local protrusion portion LP21 can compensate for the weak portions of the first conductive barrier layer 272 on the local protrusion portions.

As illustrated in FIG. 2A, an upper surface of the metal plug 286 of each of the interconnection structures WS2 may be covered with a third conductive barrier layer 292. The third conductive barrier layer 292 has substantially the same structure as the third conductive barrier layer 192 described with reference to FIG. 1A.

The integrated circuit device 200 illustrated in FIGS. 2A and 2B includes the metal-containing particles 282B irregularly dispersed in the lower plug region PA21 of the metal plug 286 of each of the interconnection structures WS2. Among the metal-containing particles 282B, the first dispersion particles MOS diffused into a portion of the lower plug region PA21 adjacent to the second conductive barrier layer 274 may reinforce a weak portion of the first conductive barrier layer 272 which is on the local protrusion portion LP21, thereby reducing or preventing unintended perme- ation of external impurities such as oxygen atoms into each of the interconnection structures WS2 and protecting a portion of the metal plug 286 of each of the interconnection structures WS2 which is relatively vulnerable to attack from the outside due to the local protrusion portion LP21. There- fore, in each of the interconnection structures WS2, the thickness of the first conductive barrier layer 272 may be reduced. As a result, an increase in the resistance and leakage current of each of the interconnection structures WS2 may be suppressed, and migration of electrons from the metal plugs 286 may be suppressed, thereby improving the reliability of the interconnection structures WS2 includ- ing the metal plugs 286.

Figure 3:
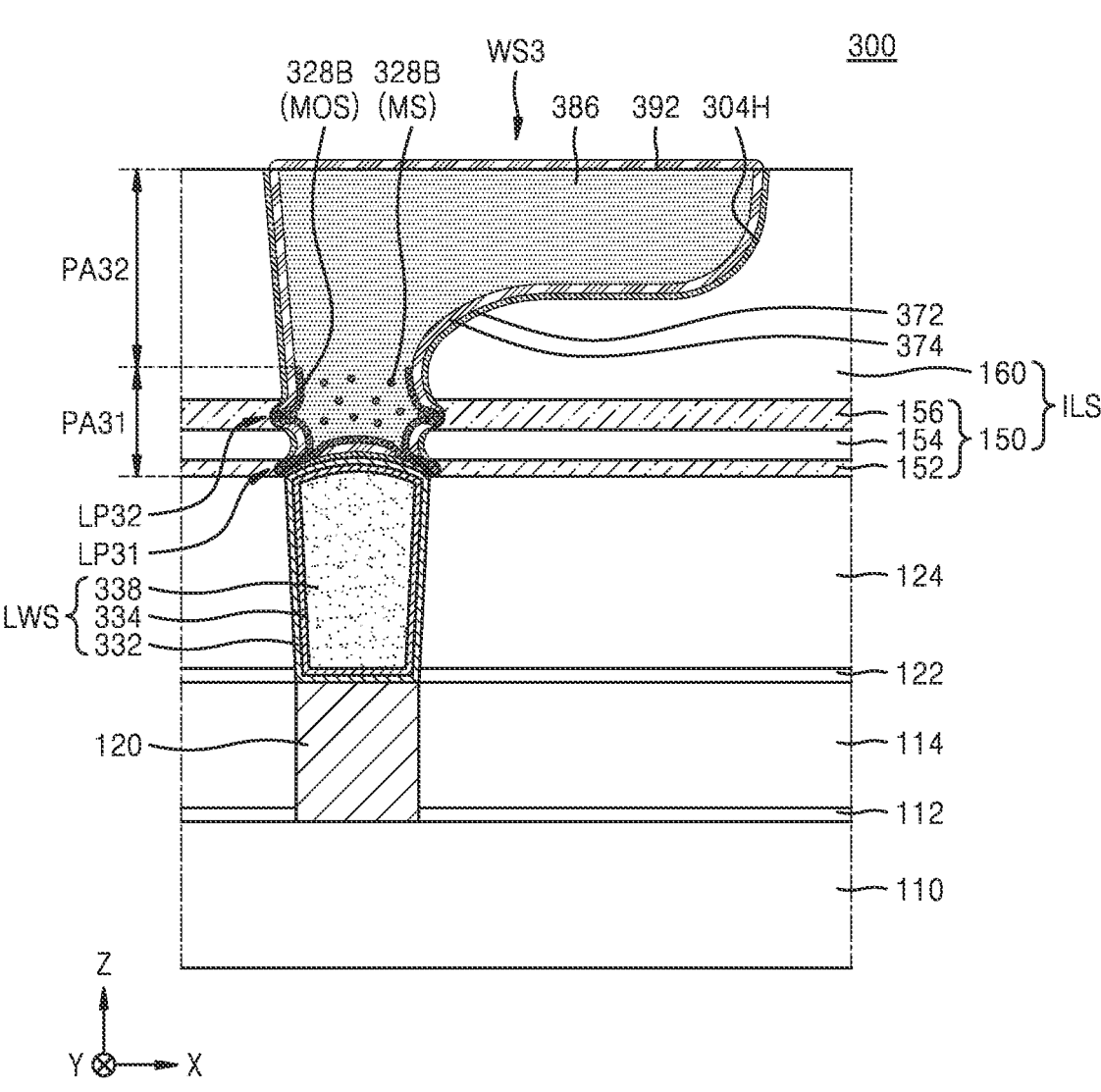
FIG. 3 is a schematic cross-sectional view illustrating an integrated circuit device according to other embodiments.

FIG. 3 is a schematic cross-sectional view illustrating an integrated circuit device 300 according to other embodi- ments. In FIG. 3 and FIGS. 1A and 1B, like reference numerals denote like elements, and repeated descriptions thereof are omitted.

Referring to FIG. 3, the integrated circuit device 300 has substantially the same structure as the integrated circuit device 100 described with reference to FIGS. 1A and 1B. The integrated circuit device 300 includes a plurality of interconnection structures WS3 penetrating, in a vertical direction (Z direction), an insulating structure ILS disposed above a substrate 110. Each of the interconnection structures WS3 may penetrate an interlayer etch stop layer 150 and an interlayer insulating layer 160 in the vertical direction (Z direction). Each of the interconnection structures WS3 may include a first local protrusion portion LP31 and a second local protrusion portion LP32 that are adjacent to a lower surface of the insulating structure ILS and protrude outward more than other portions of the interconnection structure WS3 in a horizontal direction (for example, an X direction in FIG. 3). The first and second local protrusion portions LP31 and LP32 respectively have substantially the same structures as the first and second local protrusion portions LP1 and LP2 described with reference to FIGS. 1A and 1B.

Each of the interconnection structures WS3 may include a metal plug 386 and a plurality of metal-containing par- ticles 382B irregularly disposed in the metal plug 386. The metal plug 386 and the metal-containing particles 382B respectively have substantially the same structures as the metal plug 186 and the metal-containing particles 182B described with reference to FIGS. 1A and 1B. However, the metal plug 386 may be formed in a hole 304H that is formed in the insulating structure ILS by a dual damascene process.

The metal plug 386 may include: a lower plug region PA31 closer to the substrate 110 in the vertical direction (Z direction) than an upper plug region PA32, and separated from an upper surface of the metal plug 336 in the vertical direction (Z direction), by the upper plug region PA32. The upper plug region PA32 can be a remaining region of the metal plug 386 other than the lower plug region PA31. The lower plug region PA31 may include the first and second local protrusion portions LP31 and LP32. The metal-con- taining particles 382B included in the metal plug 386 may be irregularly dispersed in the lower plug region PA31. In the metal plug 386, for example, the lower plug region PA31 may include a Cu layer in which Mn atoms are dispersed, and the upper plug region PA32 may include a Cu layer including no Mn atoms. The lower plug region PA31 and the upper plug region PA32 respectively can have substantially the same structures as the lower plug region PA11 and the upper plug region PA12 described with reference to FIGS. 1A and 1B.

In the lower plug region PA31 of the metal plug 386, the metal-containing particles 382B may be dispersed at a relatively high density in edge portions of the metal plug 386 such as lower-surface and sidewall portions of the metal plug 386, particularly in portions included in the first local protrusion portion LP31 and the second local protrusion portion LP32. In the lower plug region PA31, the metal- containing particles 382B may be dispersed at a relatively low density in a center portion of the metal plug 386, where the metal-containing particles 382B can have a density gradient that increases from the interior of the metal plug 386 towards the second conductive barrier layer 374. The upper plug region PA32 of the metal plug 386 may not include the metal-containing particles 382B. The upper plug region PA32 may not contain manganese (Mn). The metal plug 386 and the metal-containing particles 382B respec- tively have substantially the same structures as the metal plug 186 and the metal-containing particles 182B described with reference to FIGS. 1A and 1B.

Each of the interconnection structures WS3 may include a first conductive barrier layer 372 and a second conductive barrier layer 374. The first conductive barrier layer 372 may have a variable thickness in the vertical direction (Z direc- tion). The thicknesses of at least some portions of the first conductive barrier layer 372 formed on the first local pro- trusion portion LP31 and the second local protrusion portion LP32 may be less than the thickness of a portion of the first conductive barrier layer 372 covering the lower plug region PA31 at a position farther from the substrate 110 than the first local protrusion portion LP1 is from the substrate 110 in the vertical direction (Z direction). In addition, the thickness of at least some portion of the first conductive barrier layer 372 on at least one of the first local protrusion portion LP31 and the second local protrusion portion LP32 may be less than the thickness of a portion of the first conductive barrier layer 372 covering a lower surface of the metal plug 386. The first conductive barrier layer 372 and the second con- ductive barrier layer 374 respectively can have substantially the same structures as the first conductive barrier layer 172 and the second conductive barrier layer 174 described with reference to FIGS. 1A and 1B.

In each of the interconnection structures WS3, the metal- containing particles 382B irregularly dispersed in the lower plug region PA31 of the metal plug 386 may include: first dispersion particles MOS that are in the first and second local protrusion portions LP31 and LP32 and regions adja- cent to the first and second local protrusion portions LP31 and LP32 and are adjacent to the first and second conductive barrier layers 272 and 274; and second dispersion particles MS that are dispersed in the lower plug region PA21 spaced apart from the first and second local protrusion portions LP31 and LP32 and the first and second conductive barrier layers 372 and 374.

Like the metal-containing particles 182B described with reference to FIGS. 1A and 1B, most of the metal-containing particles 382B may diffuse into a region adjacent to the second conductive barrier layer 374. The first dispersion particles MOS diffused into the region adjacent to the second conductive barrier layer 374 may reinforce weak portions of the first conductive barrier layer 372 on the first and second local protrusion portions LP31 and LP32, thereby protecting portions of the metal plug 386 of each of the interconnection structures WS3 which are relatively vulnerable to attack from the outside due to the first and second local protrusion portions LP31 and LP32.

An upper surface of the metal plug 386 of each of the interconnection structures WS3 may be covered with a third conductive barrier layer 392. The third conductive barrier layer 392 has substantially the same structure as the third conductive barrier layer 192 described with reference to FIG. 1A.

The integrated circuit device 300 may further include lower interconnection structures LWS penetrating an intermediate etch stop layer 122 and an intermediate insulating layer 124 in the vertical direction (Z direction) and having lower surfaces electrically connected to a lower conductive layer 120 and upper surfaces electrically connected to the interconnection structures WS3. Each of the lower interconnection structures LWS may include: a lower metal plug 338 including copper (Cu) but not including manganese (Mn); and a conductive barrier layer having a multi-layer structure and surrounding the lower metal plug 338. The conductive barrier layer may include a TaN layer, a Co layer, or a combination thereof. FIG. 3 illustrates an example in which the conductive barrier layer has a double layer structure including a first conductive barrier layer 332 and a second conductive barrier layer 334. In embodiments, the first conductive barrier layer 332 may include a TaN layer, and the second conductive barrier layer 334 may include a Co layer. Each of the first conductive barrier layer 332 and the second conductive barrier layer 334 may cover a lower surface, an upper surface, and a sidewall of the lower metal plug 338, where the first conductive barrier layer 332 and the second conductive barrier layer 334 may surround the lower metal plug 338. However, the lower interconnection structures LWS are not limited to the structure illustrated in FIG. 3, and various modifications and changes may be made therein.

The integrated circuit device 300 illustrated in FIG. 3 includes the metal-containing particles 382B irregularly dispersed in the lower plug region PA31 of the metal plug 386 of each of the interconnection structures WS3. Among the metal-containing particles 382B, the first dispersion particles MOS diffused into a portion of the lower plug region PA31 adjacent to the second conductive barrier layer 374 may reinforce weak portions of the first conductive barrier layer 372 which are on the first and second local protrusion portions LP31 and LP32, thereby reducing or preventing unintended permeation of external impurities such as oxygen atoms into each of the interconnection structures WS3 and protecting portions of the metal plug 386 of each of the interconnection structures WS3, which are relatively vulnerable to attack from the outside due to the first and second local protrusion portions LP31 and LP32. Therefore, in each of the interconnection structures WS3, the thickness of the first conductive barrier layer 372 may be reduced. As a result, an increase in the resistance and leakage current of each of the interconnection structures WS3 may be suppressed, and migration of electrons from the metal plugs 386 may be suppressed, thereby improving the reliability of the interconnection structures WS3 including the metal plugs 386.

Figure 4A:
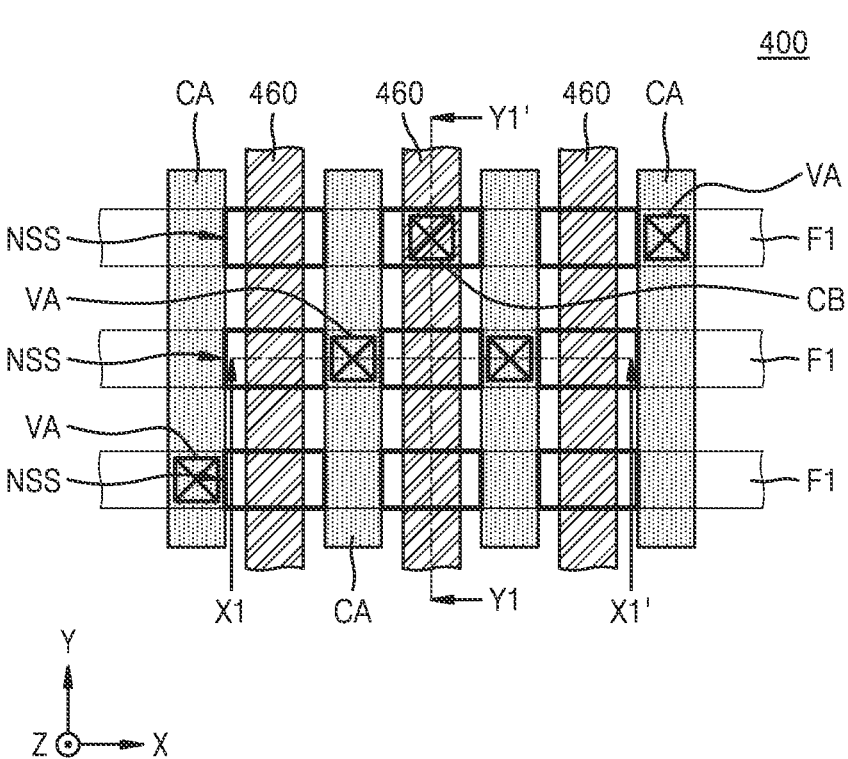
FIG. 4A is a plan layout view illustrating an integrated circuit device according to embodiments.
Figure 4B:
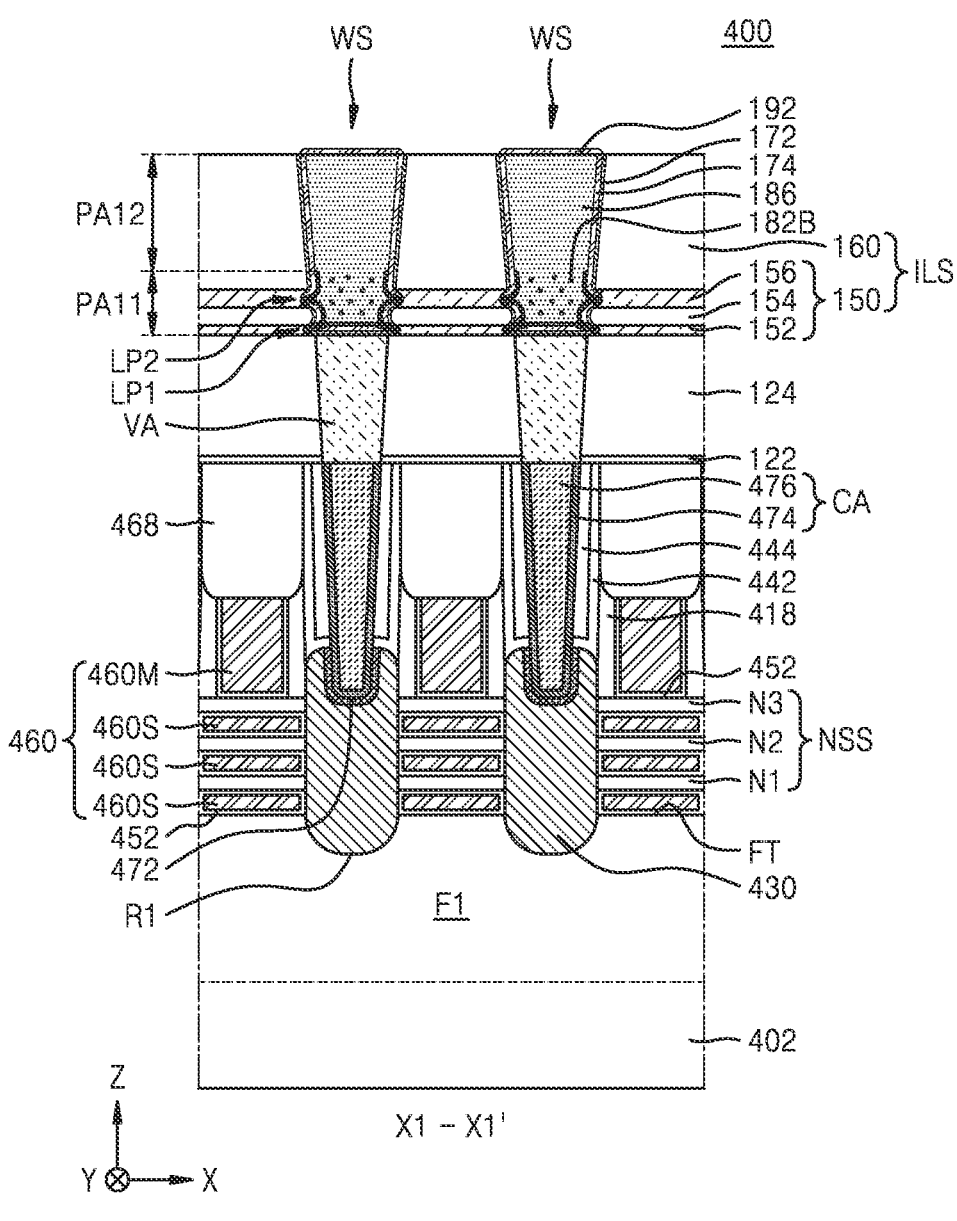
FIG. 4B is a cross-sectional view taken along line X1-X1' in FIG. 4A.
Figure 4C:
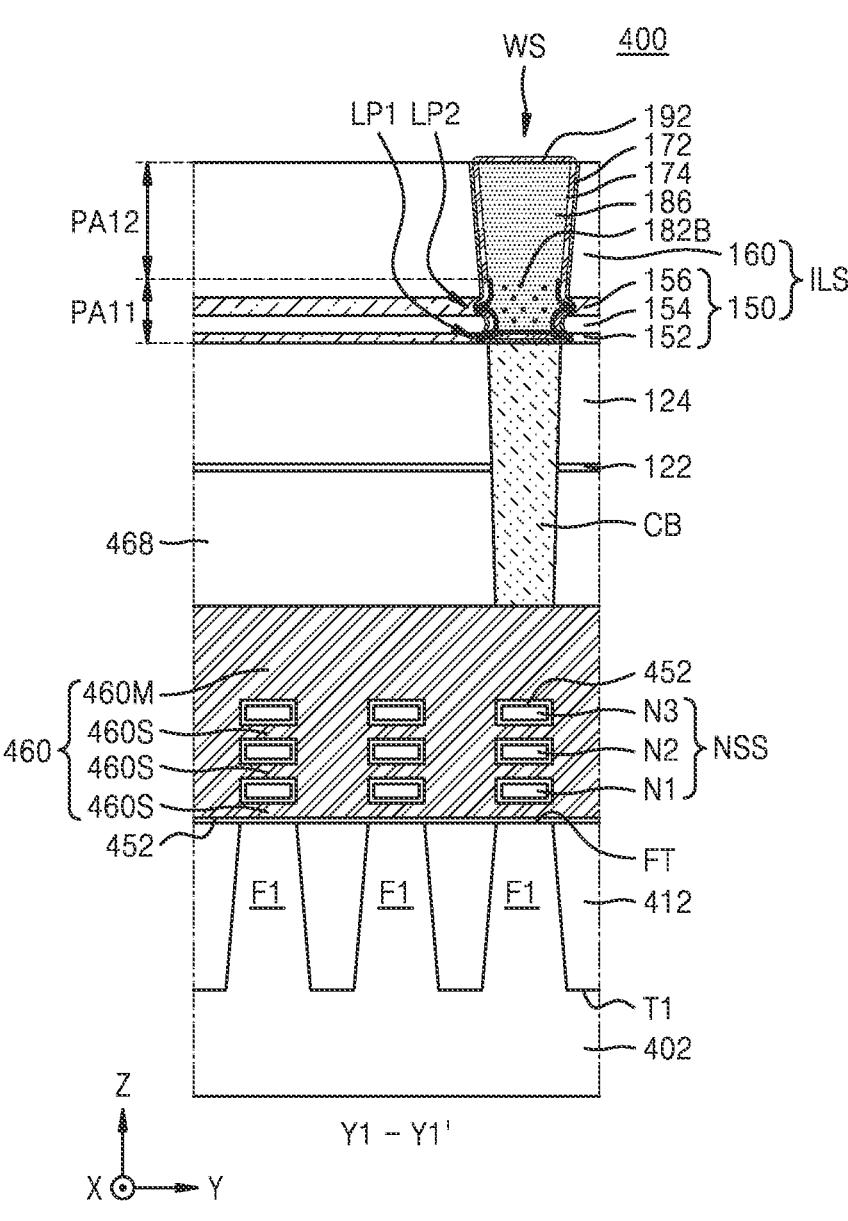
FIG. 4C is a cross-sectional view taken along line Y1-Y1' in FIG. 4A.

FIG. 4A is a plan layout view illustrating an integrated circuit device 400 according to embodiments. FIG. 4B is a cross-sectional view taken along line X1-X1' in FIG. 4A. FIG. 4C is a cross-sectional view taken along line Y1-Y1' in FIG. 4A. The integrated circuit device 400, which includes a field effect transistor having a gate-all-around structure including a nanowire-shaped or nanosheet-shaped active region and a gate surrounding the active region, is now described with reference to FIGS. 4A to 4C. In FIGS. 4A to 4C, and FIGS. 1A and 1B, like reference numerals denote like elements, and repeated descriptions thereof are omitted.

Referring to FIGS. 4A to 4C, the integrated circuit device 400 may include: a plurality of fin-type active regions F1 that protrude from a substrate 402 and extend in a first horizontal direction (X direction); and a plurality of nanosheet stacks NSS that are spaced apart upward from the fin-type active regions F1 in a vertical direction (Z direction) and face upper fin surfaces FT of the fin-type active regions F1. Herein, the term "nanosheet" refers to a conductive structure having a cross-section in a direction substantially perpendicular to a direction in which current flows. The term "nanosheet" is a term encompassing a nanowire, where the cross-section can be square or rectangular.

Trenches T1 defining the fin-type active regions F1 may be formed in the substrate 402 and may be filled with an isolation layer 412. The substrate 402 may include a semiconductor, such as Si or Ge, or a compound semiconductor such as SiGe, SiC, GaAs, InAs, InGaAs, or InP. The substrate 402 may include a conductive region, for example, a well doped with a dopant or a structure doped with a dopant. The isolation layer 412 may include an oxide layer, a nitride layer, or a combination thereof.

A plurality of gate lines 460 may be disposed on the fin-type active regions F1. Each of the gate lines 460 may extend in a second horizontal direction (Y direction) crossing the first horizontal direction (X direction).

In regions where the fin-type active regions F1 and the gate lines 460 cross each other, the nanosheet stacks NSS may be disposed above the upper fin surfaces FT of the fin-type active regions F1. Each of the nanosheet stacks NSS may include at least one nanosheet facing the upper fin surface FT of a fin-type active region F1 at a position spaced apart from the upper fin surface FT of the fin-type active region F1 in the vertical direction (Z direction).

In embodiments, each of the nanosheet stacks NSS may include a first nanosheet N1, a second nanosheet N2, and a third nanosheet N3 that overlap each other in the vertical direction (Z direction) above a fin-type active region F1. The nanosheet stack NSS can be aligned with the fin-type active regions F1. Each of the gate lines 460 may surround the first nanosheet N1, the second nanosheet N2, and the third nanosheet N3 of a nanosheet stack NSS that overlap each other in the vertical direction (Z direction). Each of the first nanosheet N1, the second nanosheet N2, and the third nanosheet N3 of each of the nanosheet stacks NSS may function as a channel region.

Each of the gate lines 460 may include a main gate portion 460M and a plurality of sub-gate portions 460S. The main gate portion 460M may cover upper surfaces of the nanosheet stacks NSS and may extend in the second horizontal direction (Y direction). The sub-gate portions 460S may be formed in one piece with the main gate portion 460M and may be disposed respectively between the first nanosheets N1, the second nanosheets N2, the third nanosheets N3, and the fin-type active regions F1. The sub-gate portions 460S can be between each adjacent pair of nanosheets in the nanosheet stacks NSS, and between a lowermost nanosheet and the upper fin surface FT of a fin-type active region F1. In the vertical direction (Z direction), the thickness of each of the sub-gate portions 460S may be less than the thickness of the main gate portion 460M.

A plurality of recesses R1 may be formed in the fin-type active regions F1, as illustrated in FIG. 4B. The vertical level of the lowermost surfaces of the recesses R1 may be lower than the vertical level of the upper fin surfaces FT of the fin-type active regions F1. A plurality of source/drain regions 430 may be respectively disposed in the recesses R1.

Each of the source/drain regions 430 may be adjacent to at least one gate line 460 selected from the gate lines 460. Each of the source/drain regions 430 may be in contact with the first nanosheet N1, the second nanosheet N2, and the third nanosheet N3 of a nanosheet stack NSS adjacent thereto.

Each of the gate lines 460 may include a metal, a metal nitride, a metal carbide, or a combination thereof. The metal may be selected from Ti, W, Ru, Nb, Mo, Hf, Ni, Co, Pt, Yb, Th, Dy, Er, and Pd. The metal nitride may be selected from TiN and TaN. The metal carbide may be TiAlC. However, the materials of the gate lines 460 are not limited to the materials listed above as examples. Each of the gate lines 460 may further include a gap-fill metal layer. The gap-fill metal layer may include a W layer or an Al layer. In embodiments, the gate lines 460 may have a TiN layer, a TiAlC/TiN/W stack structure, a TiN/TaN/TiAlC/TiN/W stack structure, or a TiN/TaN/TiN/TiAlC/TiN/W stack structure. However, the gate lines 460 are not limited thereto.

Gate dielectric layers 452 may be arranged between the nanosheet stacks NSS and the gate lines 460. In embodiments, each of the gate dielectric layers 452 may have a structure in which an interface dielectric layer and a high-k dielectric layer are stacked. The interface dielectric layer may include a low-k dielectric material layer having a dielectric constant of about 9 or less. For example, the interface dielectric layer may include a silicon oxide layer, a silicon oxynitride layer, or a combination thereof. In embodiments, the interface dielectric layer may be omitted. The high-k dielectric layer may include a material having a higher dielectric constant than the silicon oxide layer. For example, the high-k dielectric layer may have a dielectric constant of about 10 to about 25. The high-k dielectric layer may include hafnium oxide, but is not limited thereto.

Upper surfaces of the gate dielectric layers 452 and the gate lines 460 may be covered with capping insulating patterns 468, respectively. The capping insulating patterns 468 may be in contact with the upper surfaces of the gate dielectric layers 452 and the gate lines 460. The capping insulating patterns 468 may include a silicon nitride layer.

Both sidewalls of each of the gate lines 460 and the capping insulating patterns 468 may be covered with insulating spacers 418. The insulating spacers 418 may cover both sidewalls of the main gate portions 460M above the nanosheet stacks NSS. The insulating spacers 418 may be separated from the gate lines 460 by the gate dielectric layers 452 therebetween. The insulating spacers 418 may include silicon nitride, silicon oxide, SiCN, SiBN, SION, SiOCN, SiBCN, SiOC, or a combination thereof.

The insulating spacers 418 and the source/drain regions 430 may be covered with insulating liners 442 above the substrate 402. The insulating liners 442 may each include silicon nitride (SiN), silicon oxide (SiO), SiCN, SiBN, SION, SiOCN, SiBCN, SiOC, or a combination thereof. In embodiments, the insulating liners 442 may be omitted. Inter-gate insulating layers 444 may be disposed on the insulating liners 442. The inter-gate insulating layers 444 may each include a silicon nitride layer, a silicon oxide layer, SiON, SiOCN, or a combination thereof.

Both sidewalls of the sub-gate portions 460S may be separated from the source/drain regions 430 by the gate dielectric layers 452 therebetween. The gate dielectric layers 452 may be formed between the sub-gate portions 460S of the gate lines 460 and the first nanosheets N1, the second nanosheets N2, and the third nanosheets N3, and between the sub-gate portions 460S of the gate lines 460 and the source/drain regions 430, where the gate dielectric layers

452 may surround at least a portion of each of the nanosheets in the stack of nanosheets NSS.

A plurality of nanosheet transistors may be formed above the substrate 402 at crossing portions between the fin-type active regions F1 and the gate lines 460. The first nanosheets N1, the second nanosheets N2, and the third nanosheets N3 of the nanosheet stacks NSS may each have a channel region. In embodiments, each of the first nanosheets N1, the second nanosheets N2, and the third nanosheets N3 of the nanosheet stack NSS may include a Si layer, a SiGe layer, or a combination thereof.

Metal silicide layers 472 may be respectively formed on upper surfaces of the source/drain regions 430. The metal silicide layers 472 may include a metal including Ti, W, Ru, Nb, Mo, Hf, Ni, Co, Pt, Yb, Tb, Dy, Er, or Pd. For example, the metal silicide layers 472 may include titanium silicide, but are not limited thereto. The metal silicide layers 472 can form an electrical contact between the source/drain regions 430 and a source/drain contact CA.

The insulating liners 442 and the inter-gate insulating layers 444 may be sequentially disposed on the source/drain regions 430 and the metal silicide layers 472. The insulating liners 442 and the inter-gate insulating layers 444 may form lower insulating structures. In embodiments, the insulating liners 442 may include silicon nitride (SiN), SiCN, SiBN, SiON, SiOCN, SiBCN, or a combination thereof, but are not limited thereto. The inter-gate insulating layers 444 may include a silicon oxide layer, but are not limited thereto.

A plurality of source/drain contacts CA may be respectively disposed on the source/drain regions 430. The source/drain contacts CA may respectively penetrate the inter-gate insulating layers 444 and the insulating liners 442 in the vertical direction (Z direction) and may be in physical and electrical contact with the metal silicide layers 472. The source/drain contacts CA may be electrically connected to the source/drain regions 430 through the metal silicide layers 472, respectively. The source/drain contacts CA may be separated from the main gate portions 460M in the first horizontal direction (X direction) by the insulating spacers 418 therebetween. The inter-gate insulating layers 444 and the insulating liners 442 can be between at least a portion of the source/drain contacts CA and the main gate portions 460M in the first horizontal direction (X direction).

Each of the source/drain contacts CA may include a conductive barrier layer 474 and a contact plug 476 that are sequentially stacked on a metal silicide layer 472. The conductive barrier layer 474 may surround a lower surface and a sidewall of the contact plug 476 and may be in contact with the lower surface and sidewall of the contact plug 476. In embodiments, the conductive barrier layer 474 may include a metal or a metal nitride. For example, the conductive barrier layer 474 may include Ti, Ta, W, TiN, TaN, WN, WCN, TiSiN, TaSiN, WSiN, or a combination thereof, but is not limited thereto. The contact plug 476 may include a metal selected from the group consisting of molybdenum (Mo), copper (Cu), tungsten (W), cobalt (Co), ruthenium (Ru), manganese (Mn), titanium (Ti), tantalum (Ta), aluminum (Al), and a combination thereof.

An intermediate etch stop layer 122 and an intermediate insulating layer 124 may be sequentially disposed on upper surfaces of each of the source/drain contacts CA and the capping insulating patterns 468. As illustrated in FIG. 4B, a plurality of first contact structures VA may respectively be disposed on the source/drain contacts CA. The first contact structures VA may penetrate the intermediate etch stop layer 122 and the intermediate insulating layer 124 in the vertical direction (Z direction) and may be in physical and electrical contact with the source/drain contacts CA. The source/drain regions 430 may be electrically connected to the first contact structures VA through the metal silicide layers 472 and the source/drain contacts CA.

As illustrated in FIG. 4C, second contact structures CB may be disposed on the gate lines 460. The second contact structures CB may be horizontally spaced apart from the first contact structures VA. The second contact structures CB may penetrate the capping insulating patterns 468, the intermediate etch stop layer 122, and the intermediate insulating layer 124 in the vertical direction (Z direction) and may be connected to the gate lines 460. Lower surfaces of the second contact structures CB may be in physical and electrical contact with upper surfaces of the gate lines 460.

In embodiments, each of the first contact structures VA and the second contact structures CB may include copper (Cu), tungsten (W), TaN, cobalt (Co), or a combination, but is not limited thereto. For example, at least one of the first contact structures VA and the second contact structures CB may be substantially the same as the lower interconnection structures LWS described with reference to FIG. 3, but is not limited thereto.

An insulating structure ILS and a plurality of interconnection structures WS penetrating the insulating structure ILS in the vertical direction (Z direction) may be disposed on the intermediate insulating layer 124. The insulating structure ILS and the interconnection structures WS may be respectively the same as the insulating structure ILS and the interconnection structures WS described with reference to FIGS. 1A and 1B.

Like the integrated circuit device 100 described with reference to FIGS. 1A and 1B, the integrated circuit device 400 described with reference to FIGS. 4A to 4C includes the interconnection structures WS each including a metal plug 186 and a plurality of metal-containing particles 182B irregularly dispersed in a lower plug region PA11 of the metal plug 186. Among the metal-containing particles 182B, first dispersion particles MOS diffused into a portion of the lower plug region PA11 adjacent to a second conductive barrier layer 174 may reinforce weak portions of a first conductive barrier layer 172, which are on first and second local protrusion portions LP1 and LP2, thereby protecting portions of the metal plug 186 of each of the interconnection structures WS, which are relatively vulnerable to attack from the outside due to the first and second local protrusion portions LP1 and LP2. Therefore, an increase in the resistance and leakage current of each of the interconnection structures WS may be suppressed, and migration of electrons from the metal plugs 186 may be suppressed, thereby improving the reliability of the interconnection structures WS including the metal plugs 186.

FIGS. 5, 6, 7A, 8A, 9A, 10A, 11A, 12A, 13, and 14 are cross-sectional views sequentially illustrating processes of a method of manufacturing an integrated circuit device according to embodiments. FIGS. 7B, 8B, 9B, 10B, 11B, and 12B are enlarged cross-sectional views illustrating portions EX1 in FIGS. 7A, 8A, 9A, 10A, 11A, and 12A. A method of manufacturing the integrated circuit device 100 described with reference to FIGS. 1A and 1B is now described with reference to FIGS. 5 to 14 as an example method. In FIGS. 5 to 14, and FIGS. 1A and 1B, like reference numerals denote like elements, and repeated descriptions thereof are omitted.

Figure 5:
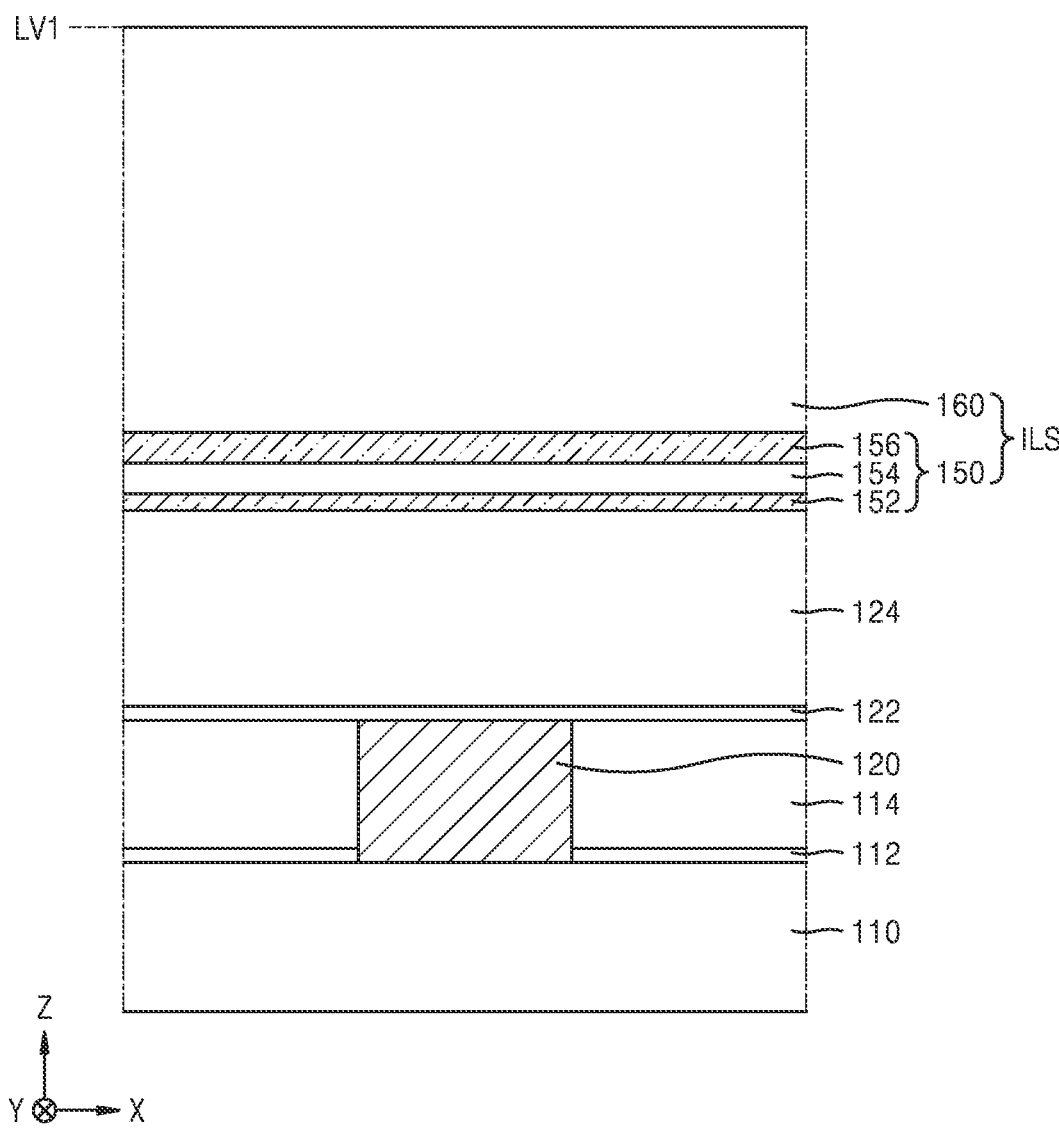
FIGS. 5, 6, 7A, 8A, 9A, 10A, 11A, 12A, 13, and 14 are cross-sectional views sequentially illustrating processes of a method of manufacturing an integrated circuit device according to embodiments.

Referring to FIG. 5, a lower etch stop layer 112 and a lower insulating layer 114 are formed on a substrate 110, a lower conductive layer 120 may be formed such that the lower conductive layer 120 may be electrically connected to a conductive region of the substrate 110 through the lower insulating layer 114 and the lower etch stop layer 112.

The lower conductive layer 120 may be formed by partially etching the lower insulating layer 114 and the lower etch stop layer 112 to form an opening, and then filling the opening with a conductive material. In some embodiments, the lower conductive layer 120 may be an interconnection layer including a metal layer and a conductive barrier layer surrounding the metal layer. The metal layer may include Cu, W, Al, or Co. The conductive barrier layer may include Ta, TaN, Ti, TiN, or a combination thereof. The lower conductive layer 120 may be electrically connected to a conductive region formed in the substrate 110. In some other embodiments, the lower conductive layer 120 may be a source/drain region, a source/drain contact, a via contact, or a gate contact of a transistor, but is not limited thereto.

An intermediate etch stop layer 122 and an intermediate insulating layer 124 are formed on the lower insulating layer 114, and a first aluminum (Al)-containing etch stop layer 152, a SiOC layer 154, and a second aluminum (Al)-containing etch stop layer 156 may be sequentially formed on the intermediate insulating layer 124 to form an interlayer etch stop layer 150 having a multi-layer structure. Thereafter, an interlayer insulating layer 160 may be formed on the interlayer etch stop layer 150. The interlayer insulating layer 160 may have an upper surface at a first vertical level LV1.

Figure 6:
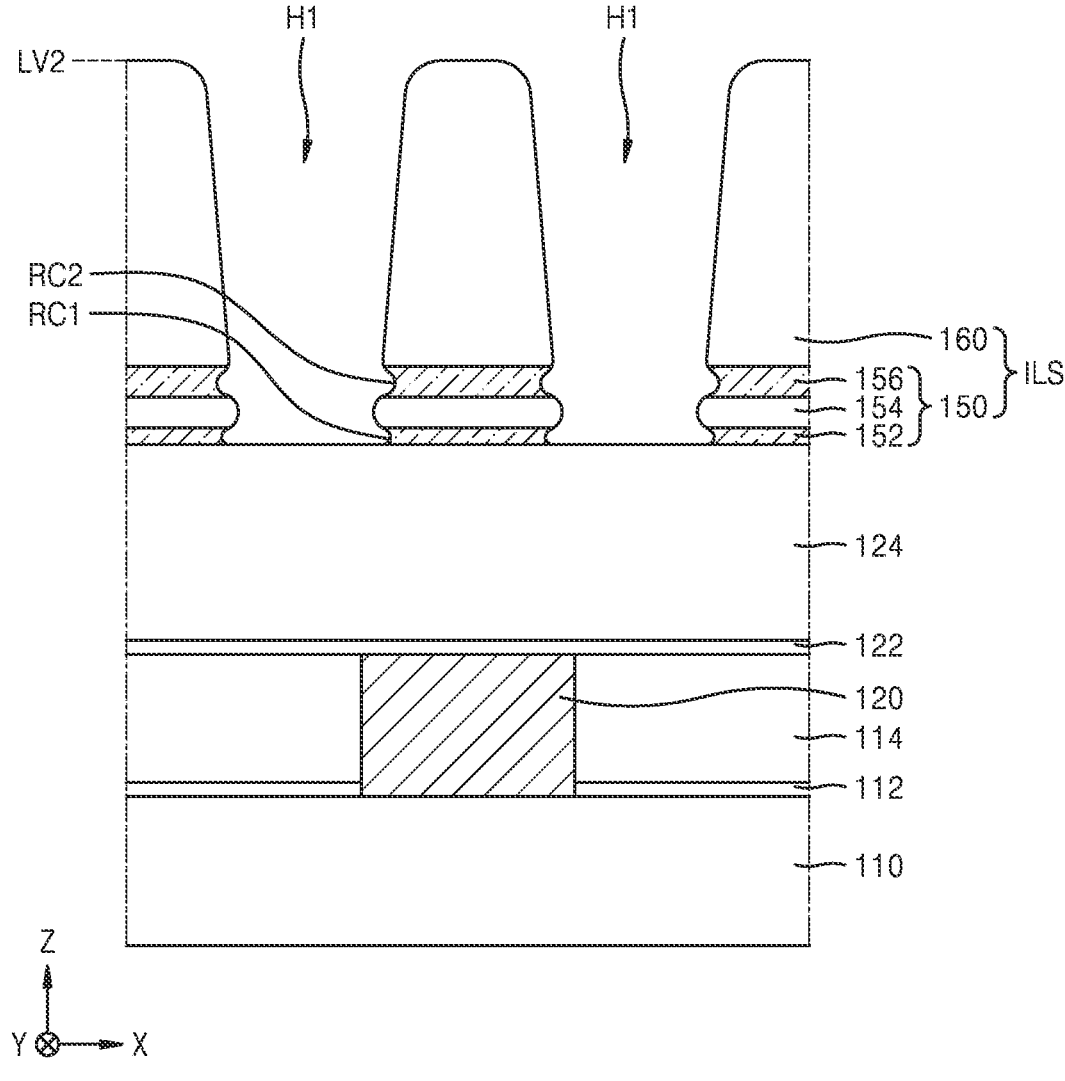

Referring to FIG. 6, in a resultant structure shown in FIG. 5, regions of the interlayer insulating layer 160 can be removed by etching and sequentially using the second aluminum (Al)-containing etch stop layer 156, the SiOC layer 154, and the first aluminum (Al)-containing etch stop layer 152 as etch stop layers to form a plurality of holes H1 that penetrate the interlayer etch stop layer 150 and the interlayer insulating layer 160 in a vertical direction (Z direction), and expose an upper surface of the intermediate insulating layer 124.

Portions of the first aluminum (Al)-containing etch stop layer 152 and the second aluminum (Al)-containing etch stop layer 156 exposed through the holes H1 may be removed more than the SiOC layer 154 in a horizontal direction due to etch selectivity of the different layer materials and the etching atmosphere used for forming the holes H1 and a subsequent cleaning atmosphere. As a result, recess surfaces RC1 and RC2 may be formed, which define undercut regions communicating with the holes H1 in the vicinity of exposed surfaces of the first aluminum (Al)-containing etch stop layer 152 and the second aluminum (Al)-containing etch stop layer 156, At a vertical level at which the recess surfaces RC1 and RC2 are formed, the width of the holes H1 may locally increase in the horizontal direction (for example, an X direction or a Y direction in FIG. 6). In embodiments, the recess surfaces RC1 and RC2 are formed on the first aluminum (Al)-containing etch stop layer 152 and the second aluminum (Al)-containing etch stop layer 156, such that the undercut regions each have a horizontal width (depth) of less than about 2 nm may be formed between the interlayer insulating layer 160 and the SiOC layer 154 and between the SiOC layer 154 and the intermediate insulating layer 124.

For example, the interlayer insulating layer 160 and the interlayer etch stop layer 150 may be dry etched using a plasma etching process or a reactive ion etching (RIE) process to form the holes H1. In this case, the second aluminum (Al)-containing etch stop layer 156, the SiOC layer 154, and the first aluminum (Al)-containing etch stop layer 152 may be sequentially used as etch endpoints, and an etch process for etching corner portions of the interlayer insulating layer 160 may be added such that whenever the second aluminum (Al)-containing etch stop layer 156, the SiOC layer 154, and the first aluminum (Al)-containing etch stop layer 152 are sequentially exposed, the corner portions of the interlayer insulating layer 160 adjacent to entrances of the holes H1 may be rounded. Owing to this, when a subsequent reflow process is performed to form a metal layer (for example, a Cu layer) for forming interconnection structures WS, reflow efficiency may be increased.

In embodiments, portions of the interlayer insulating layer 160 and portions of the interlayer etch stop layer 150 may be dry etched to form the holes H1, and then, surfaces exposed through the holes H1 may be wet-etched using an acid solution such as a sulfuric acid solution or a hydrochloric acid solution to form the holes H1 and the recess surfaces RC1 and RC2. After the holes H1 and the recess surfaces RC1 and RC2 are formed, the upper surface of the interlayer insulating layer 160 may be at a second vertical level LV2 lower than the first vertical level LV1 (refer to FIG. 5).

Figure 7A:
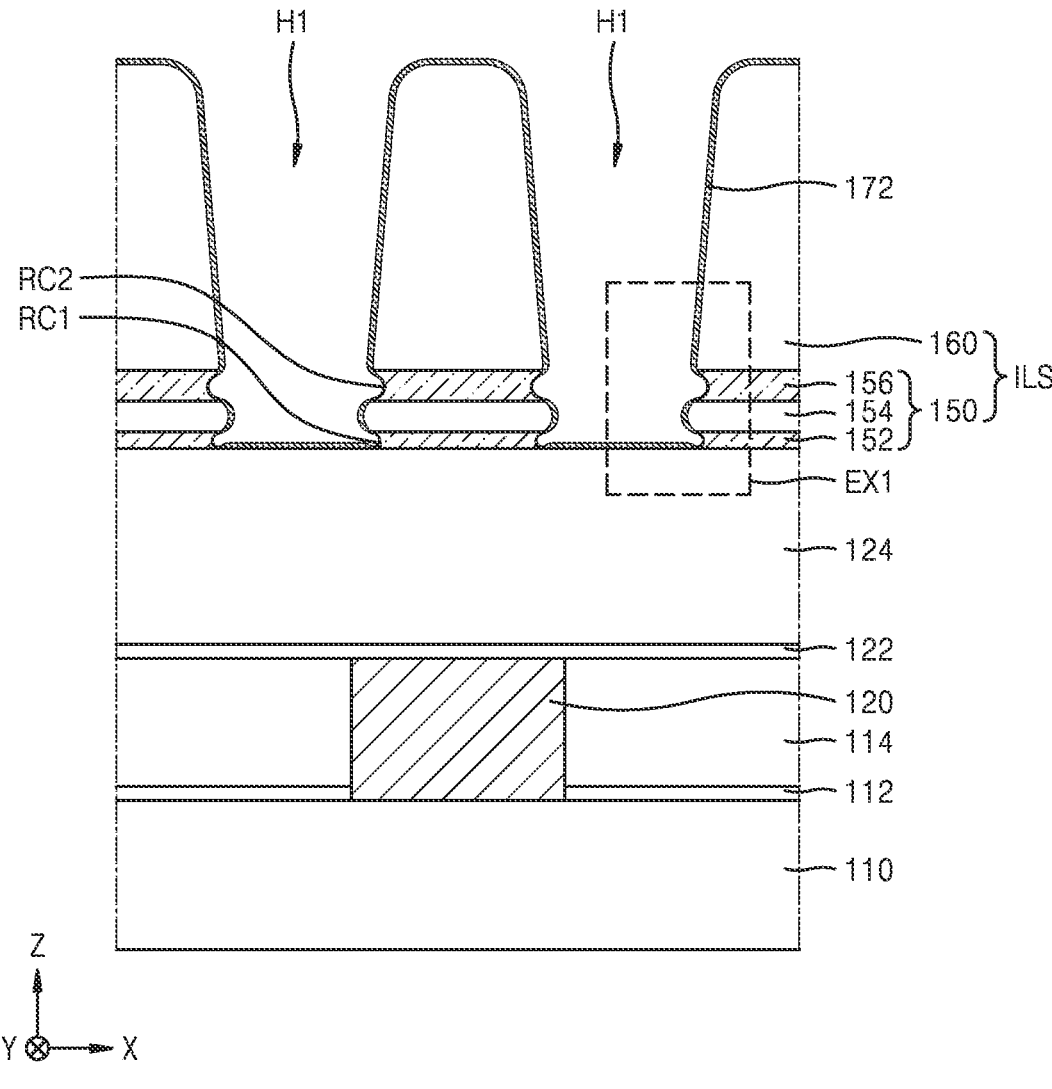
Figure 7B:
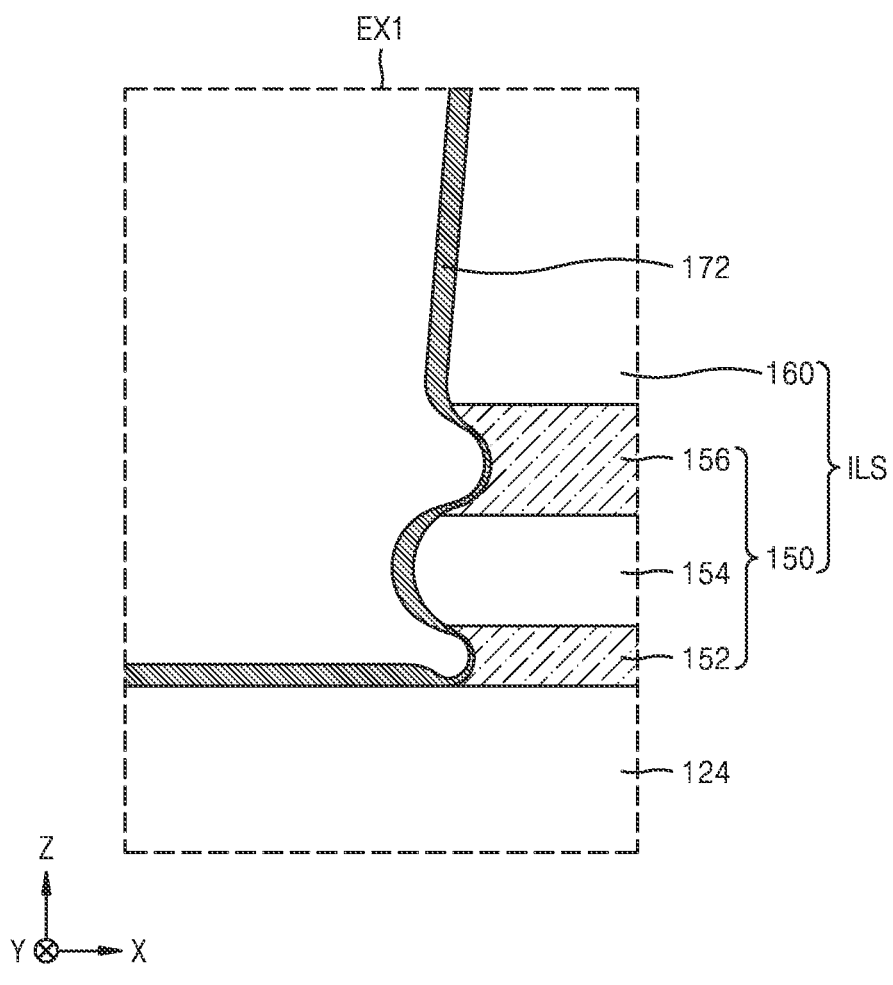
FIGS. 7B, 8B, 9B, 10B, 11B, and 12B are enlarged cross-sectional views illustrating portions EX1 in FIGS. 7A, 8A, 9A, 10A, 11A, and 12A.

Referring to FIGS. 7A and 7B, a first conductive barrier layer 172 may be formed on a resultant structure shown in FIG. 6. In embodiments, the first conductive barrier layer 172 may include a TaN layer.

An atomic layer deposition (ALD) process, a physical vapor deposition (PVD) process, or a combination thereof may be used to form the first conductive barrier layer 172. For example, a portion of the first conductive barrier layer 172 may be formed by performing an ALD process, and then the remaining portion of the first conductive barrier layer 172 may be formed by performing a PVD process. When the first conductive barrier layer 172 is formed, the thickness of the remaining portion of the first conductive barrier layer 172 formed through the PVD process may be increased to decrease the possibility of a resistance increase caused by residues of a metal precursor used in the ALD process. In embodiments, the first conductive barrier layer 172 may have a thickness of about 10 Å to about 30 Å, for example, about 20 Å to about 30 Å.

The first conductive barrier layer 172 may have a relatively large thickness on a surface of the interlayer insulating layer 160 and an upper surface of the intermediate insulating layer 124 that are exposed through the holes H1. The first conductive barrier layer 172 may have a relatively smaller thickness on portions of the recess surfaces RC1 and RC2 that are blocked by the interlayer insulating layer 160 when viewed in a direction from the entrances of the holes H1 toward the substrate 110, and/or on surfaces farthest from the centers of the holes H1. In some cases, the first conductive barrier layer 172 may be locally broken (interrupted) at portions covering the recess surfaces RC1 and RC2, where upper surfaces of the recess surfaces RC1 and RC2 may be overshadowed by overhanging material layers. The thickness of the first conductive barrier may be non-uniform over the surfaces of the hole H1 and the recess surfaces RC1 and RC2.

Figure 8A:
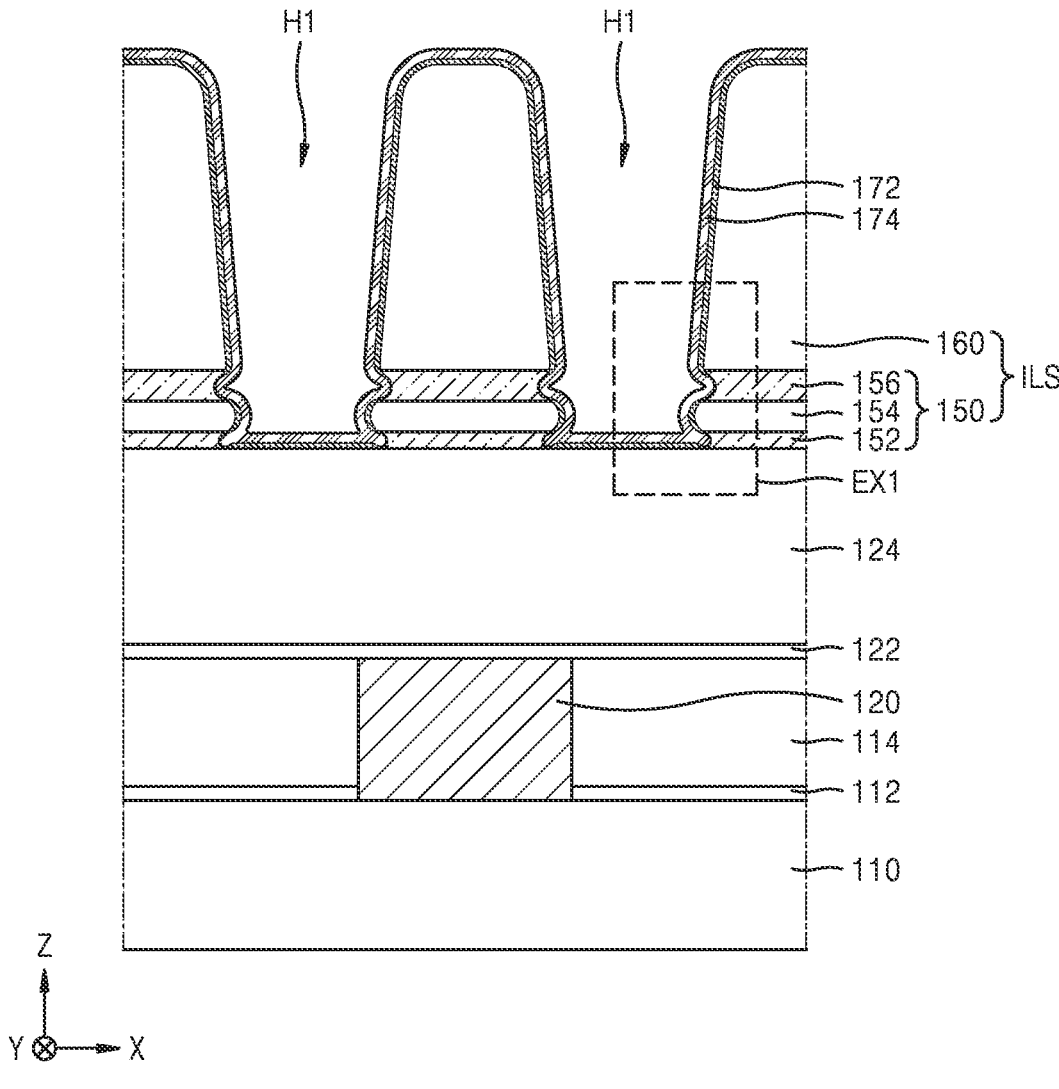
Figure 8B:
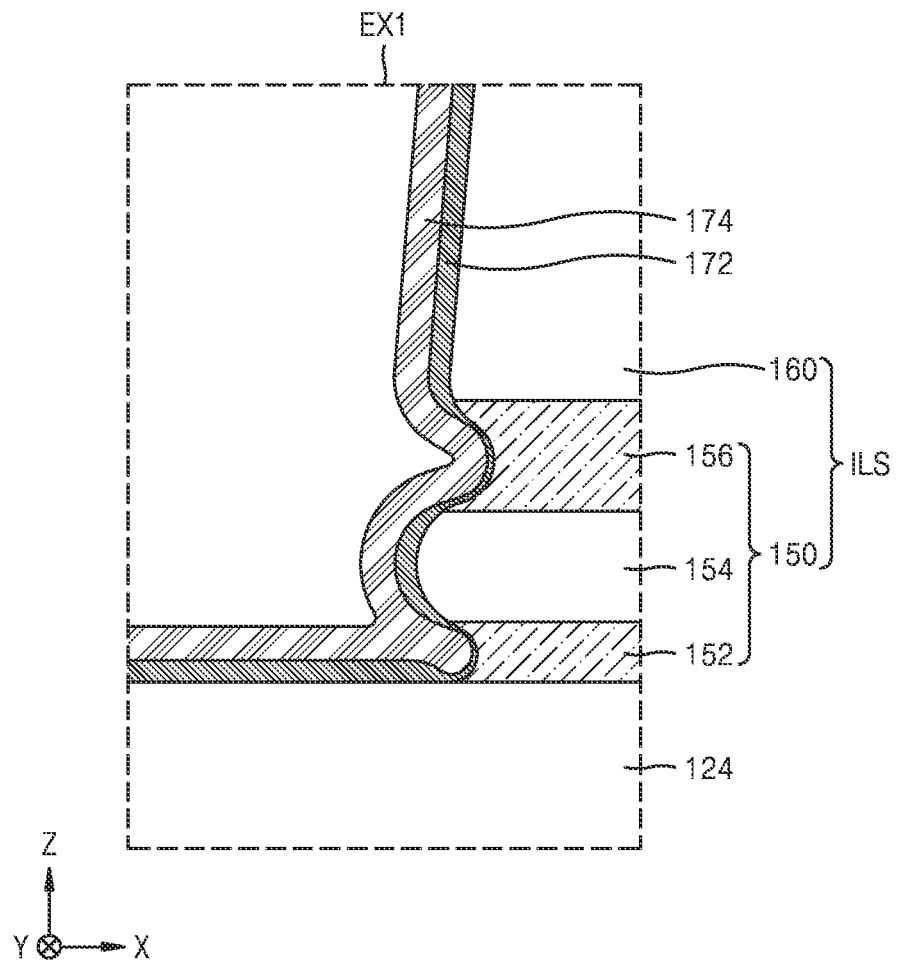

Referring to FIGS. 8A and 8B, a second conductive barrier layer 174 may be formed on a resultant structure shown in FIGS. 7A and 7B. In embodiments, the second conductive barrier layer 174 may include a Co layer.

A chemical vapor deposition (CVD) process may be performed to form the second conductive barrier layer 174. The second conductive barrier layer 174 may cover the first conductive barrier layer 172 with a substantially uniform thickness inside each of the holes H1. In embodiments, the second conductive barrier layer 174 may have a thickness of about 20 Å to about 40 Å, for example, about 30 Å to about 40 Å. In embodiments, the thickness of the second conductive barrier layer 174 may be greater than the thickness of the first conductive barrier layer 172.

Figure 9A:
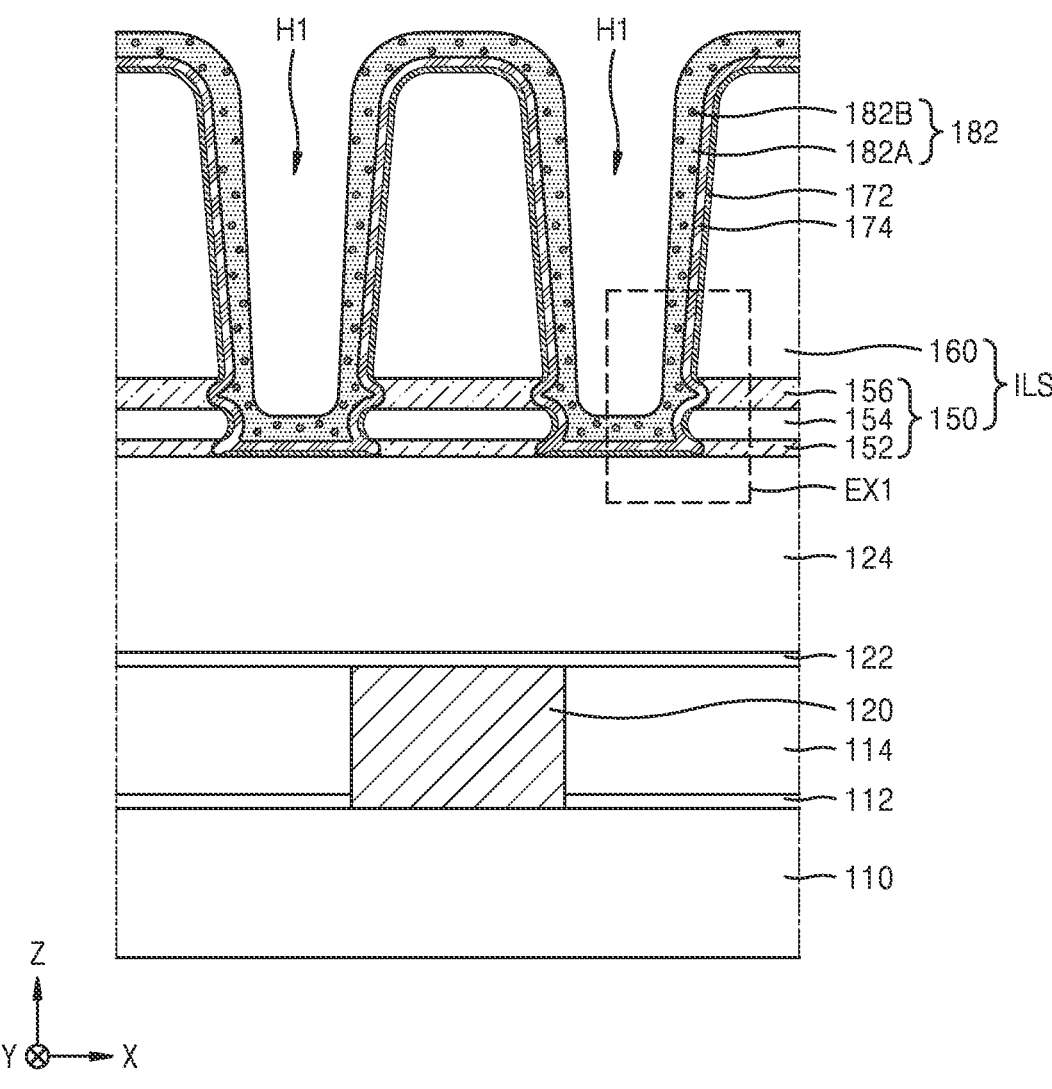
Figure 9B:
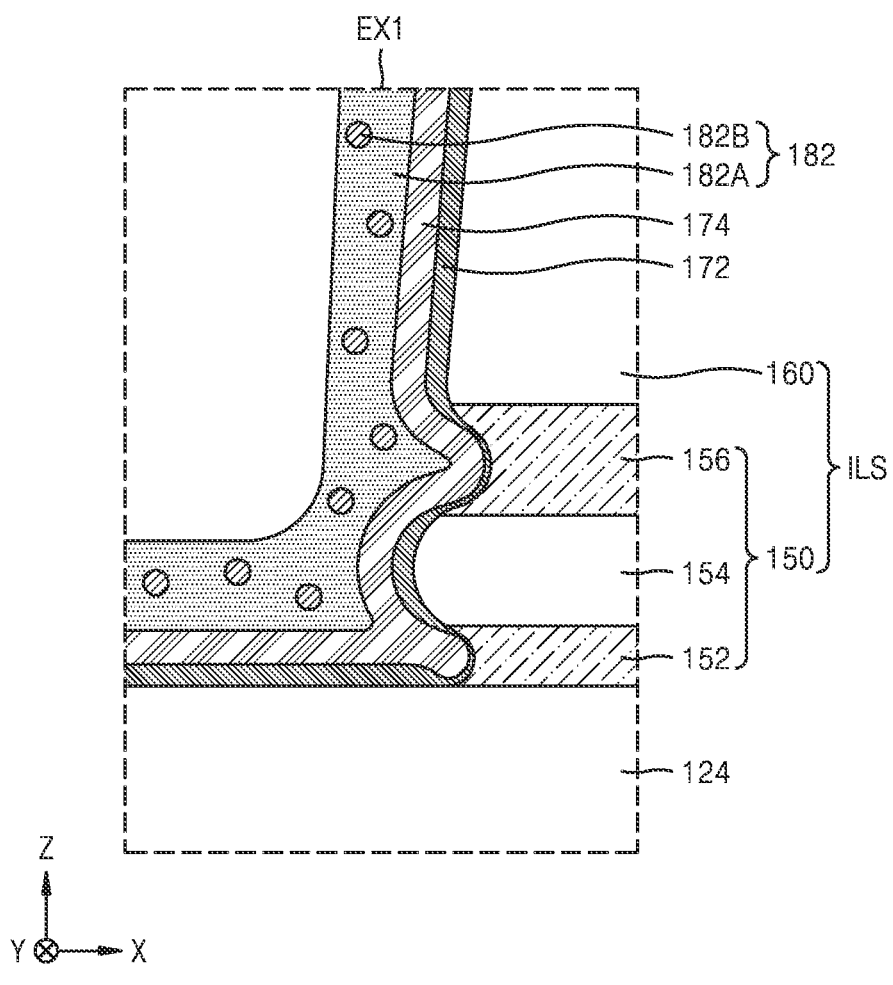

Referring to FIGS. 9A and 9B, a first local metal layer 182 including two different metals may be formed on a resultant structure shown in FIGS. 8A and 8B. A PVD process may be used to form the first local metal layer 182.

The first local metal layer 182 may include a first metal layer 182A and a plurality of metal-containing particles 182B irregularly dispersed in the first metal layer 182A. In embodiments, the first metal layer 182A may include copper (Cu), and the metal-containing particles 182B may include manganese (Mn). In embodiments, a target including a CuMn alloy containing copper (Cu) as a main metal and manganese (Mn) as an additive metal may be used to form the first local metal layer 182 using a PVD process. The content of manganese (Mn) in the target including the CuMn alloy may be about 0.1 atomic % to about 10 atomic %, for example, about 0.1 atomic % to about 1 atomic %, or about 0.5 atomic % to about 0.8 atomic %, but is not limited thereto.

Figure 10A:
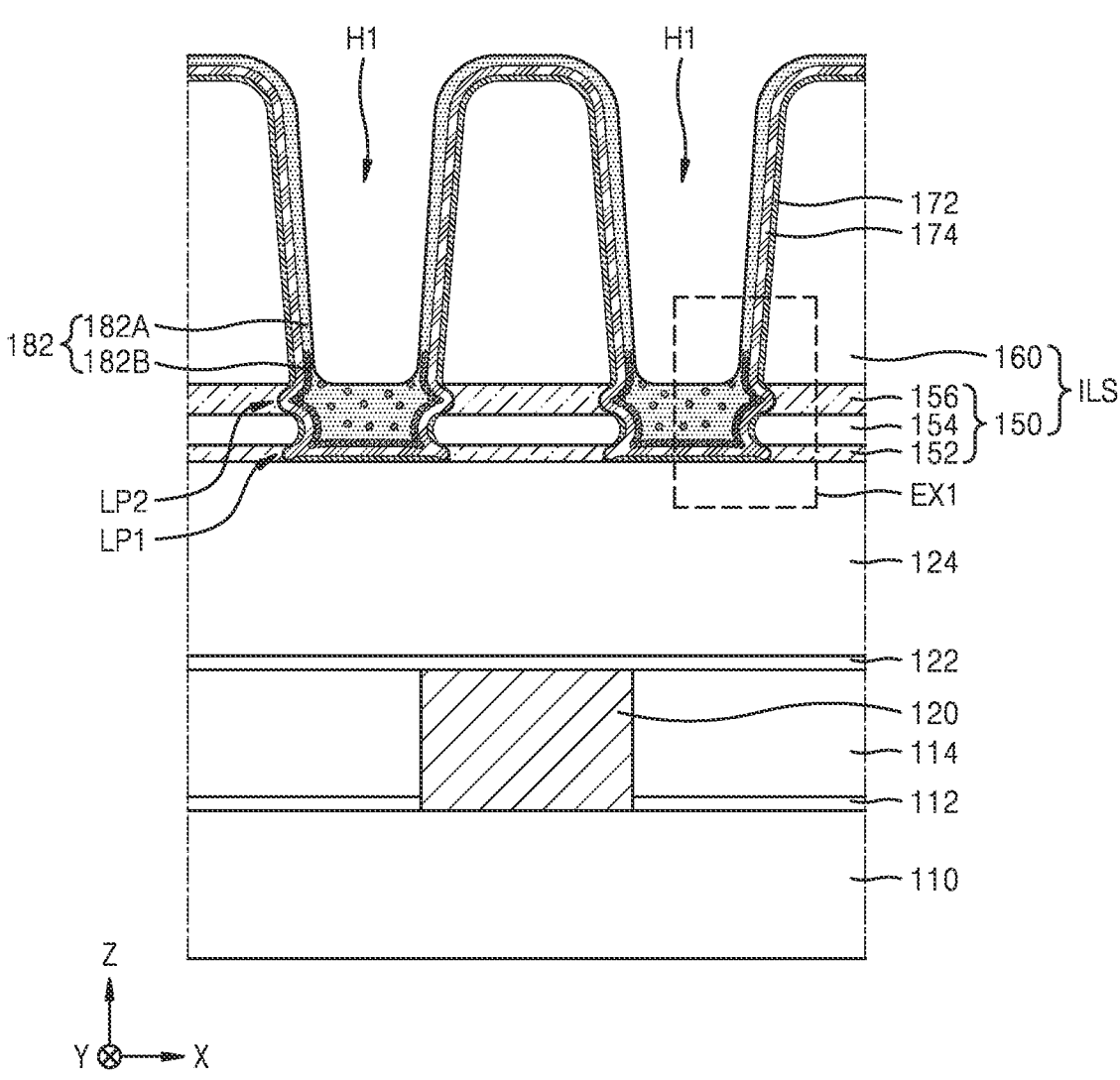
Figure 10B:
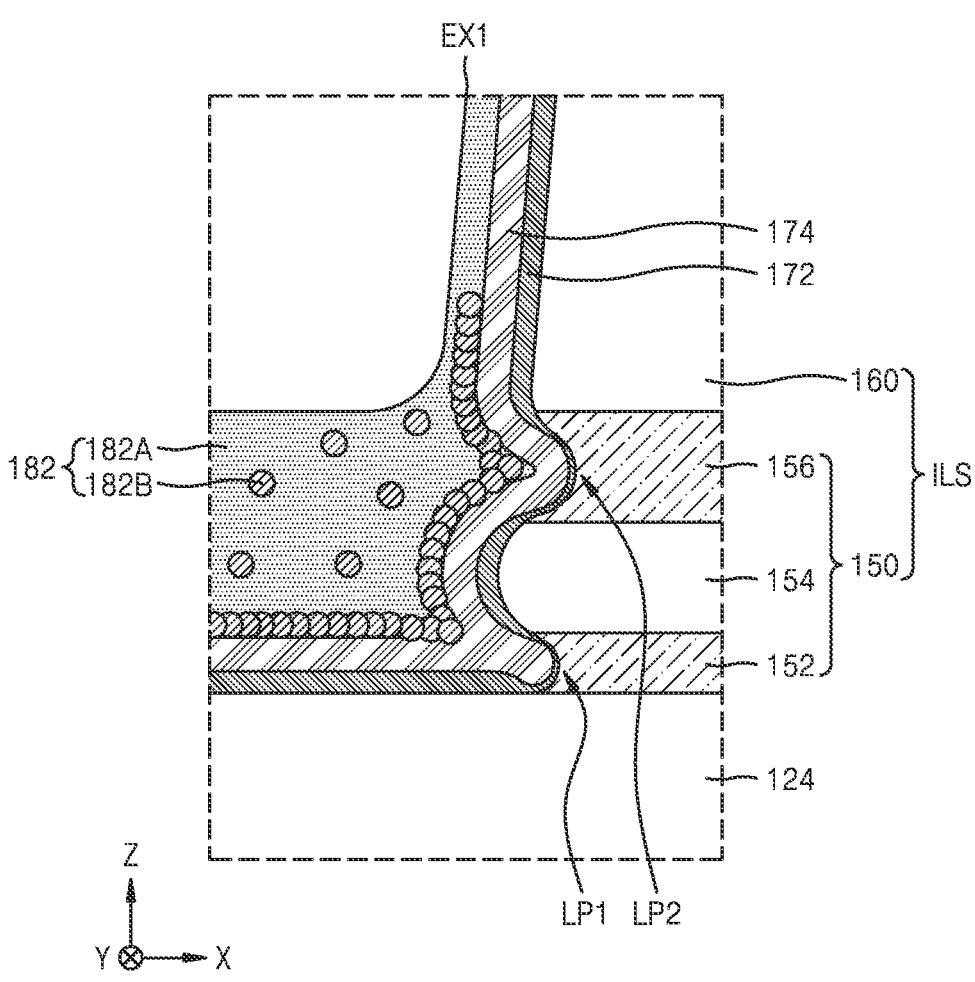

Referring to FIGS. 10A and 10B, the first local metal layer 182 may be reflowed by performing a heat treatment process or an annealing process on a resultant structure shown in FIGS. 9A and 9B. In embodiments, a lamp may be used to reflow the first local metal layer 182. Owing to the reflow of the first local metal layer 182, the shape of the first local metal layer 182 may be varied, and most of the first local metal layer 182 may be moved to a bottom side of each of the holes H1. While the first local metal layer 182 is reflowed, at least some of the metal-containing particles 182B included in the first local metal layer 182 move toward an interfacial surface of the first local metal layer 182 and gather adjacent to a surface of the second conductive barrier layer 174. Some of the metal-containing particles 182B may react with oxygen atoms permeating from the interlayer insulating layer 160 and/or the interlayer etch stop layer 150 through the first conductive barrier layer 172 and the second conductive barrier layer 174, thereby forming manganese oxide. In other embodiments, when an oxygen source used during the process of forming the second conductive barrier layer 174 remains as a residue on the second conductive barrier layer 174, some of the metal-containing particles 182B may diffuse toward the second conductive barrier layer 174 and may combine with or react with the oxygen source remaining on the second conductive barrier layer 174, thereby forming manganese oxide.

In embodiments, the process of reflowing the first local metal layer 182 may be performed at a temperature selected within a range of about 100° C. to about 500° C., for example, within a range of about 150° C. to about 250° C.

Figure 11A:
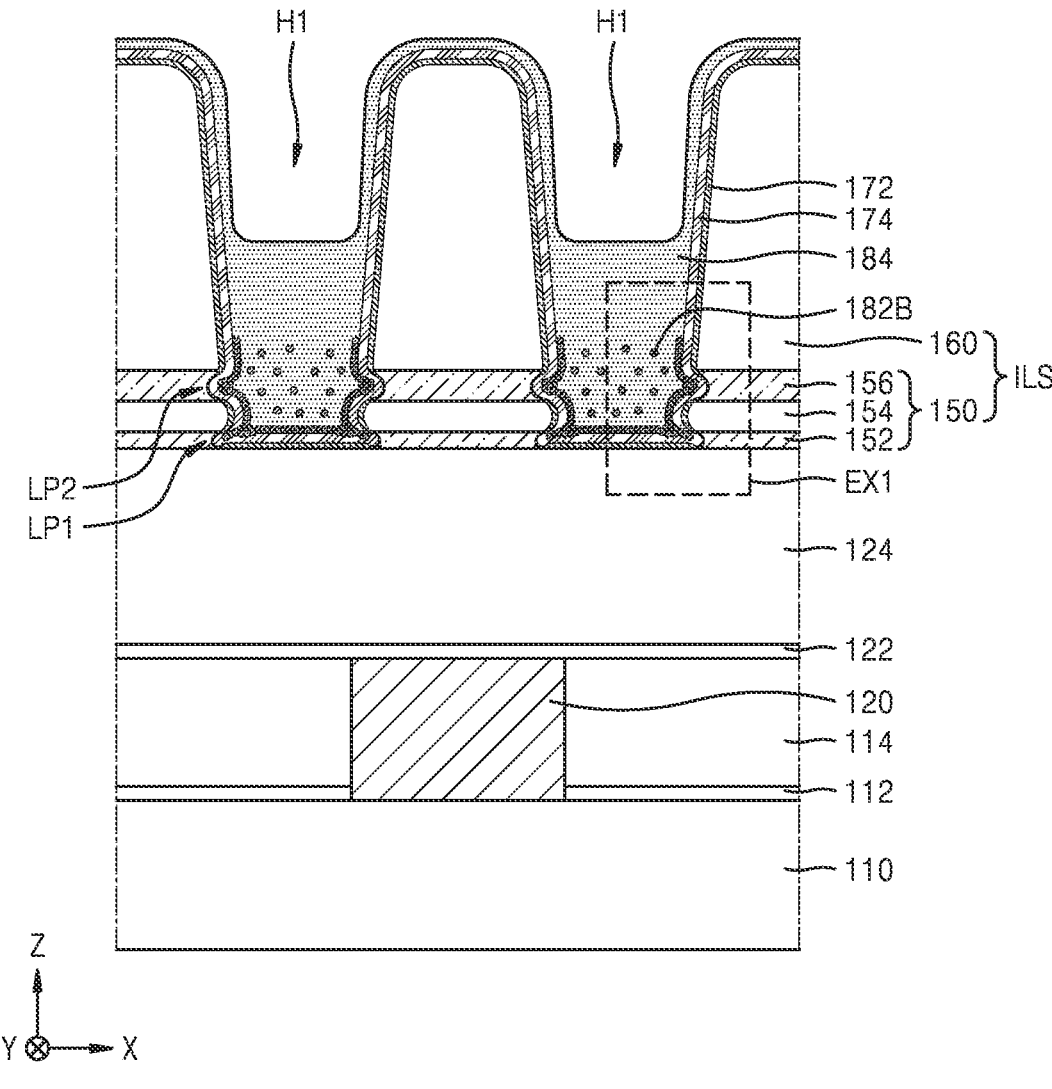
Figure 11B:
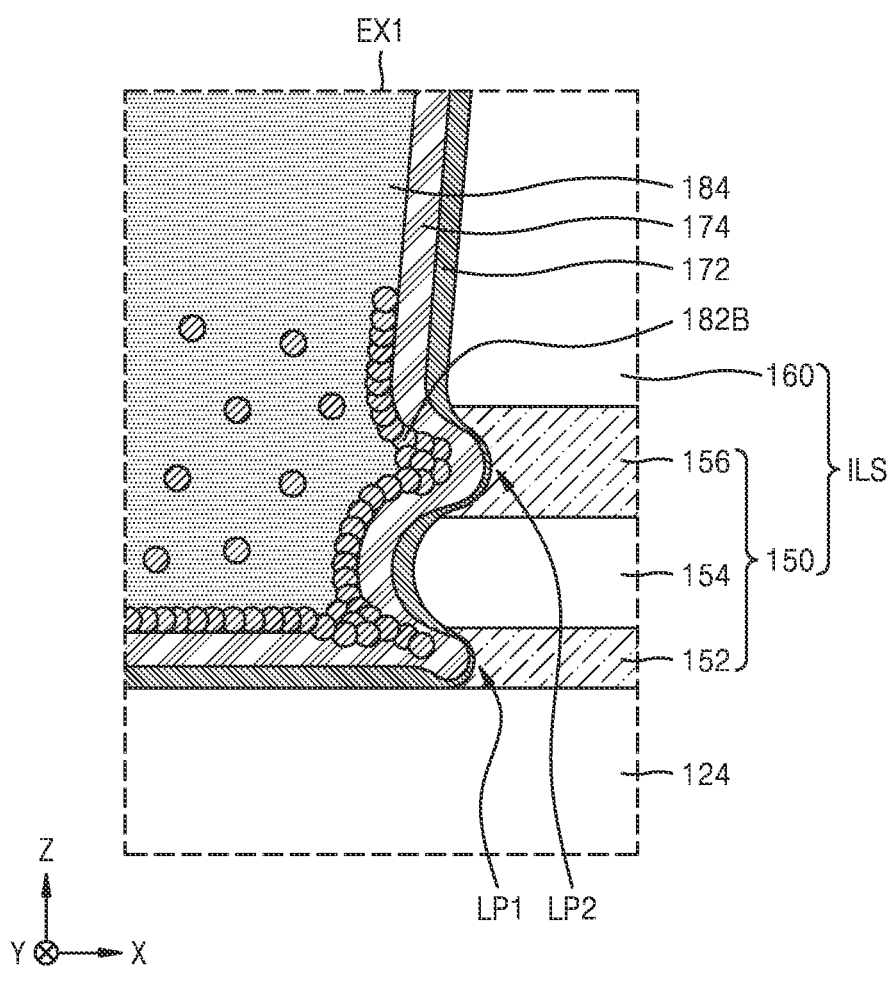

Referring to FIGS. 11A and 11B, a second local metal layer including a metal may be formed on a resultant structure shown in FIGS. 10A and 10B through using a PVD process. The second local metal layer may include the same material as the first metal layer 182A. For example, the second local metal layer may include copper (Cu). The second local metal layer may not include the metal-containing particles 182B.

Thereafter, the second local metal layer may be reflowed by performing a heat treatment process or an annealing process on the resultant structure including the second local metal layer by a method similar to the method described with reference to FIGS. 10A and 10B. Owing to the reflow of the second local metal layer, the shape of the second local metal layer may be varied, and most of the second local metal layer may be moved on the first local metal layer 182 (refer to FIGS. 10A and 10B) toward the bottom side of each of the holes H1. While the second local metal layer is reflowed, some of the metal-containing particles 182B contained in the holes H1 may be further moved adjacent to the surface of the second conductive barrier layer 174 and may react with oxygen atoms permeating from the interlayer insulating layer 160 and/or the interlayer etch stop layer 150 through the first conductive barrier layer 172 and the second conductive barrier layer 174, thereby forming manganese oxide. In addition, owing to the reflow of the second local metal layer, the first metal layer 182A of the first local metal layer 182 and the second local metal layer may be integrally combined with each other, forming a second metal layer 184.

Figure 12A:
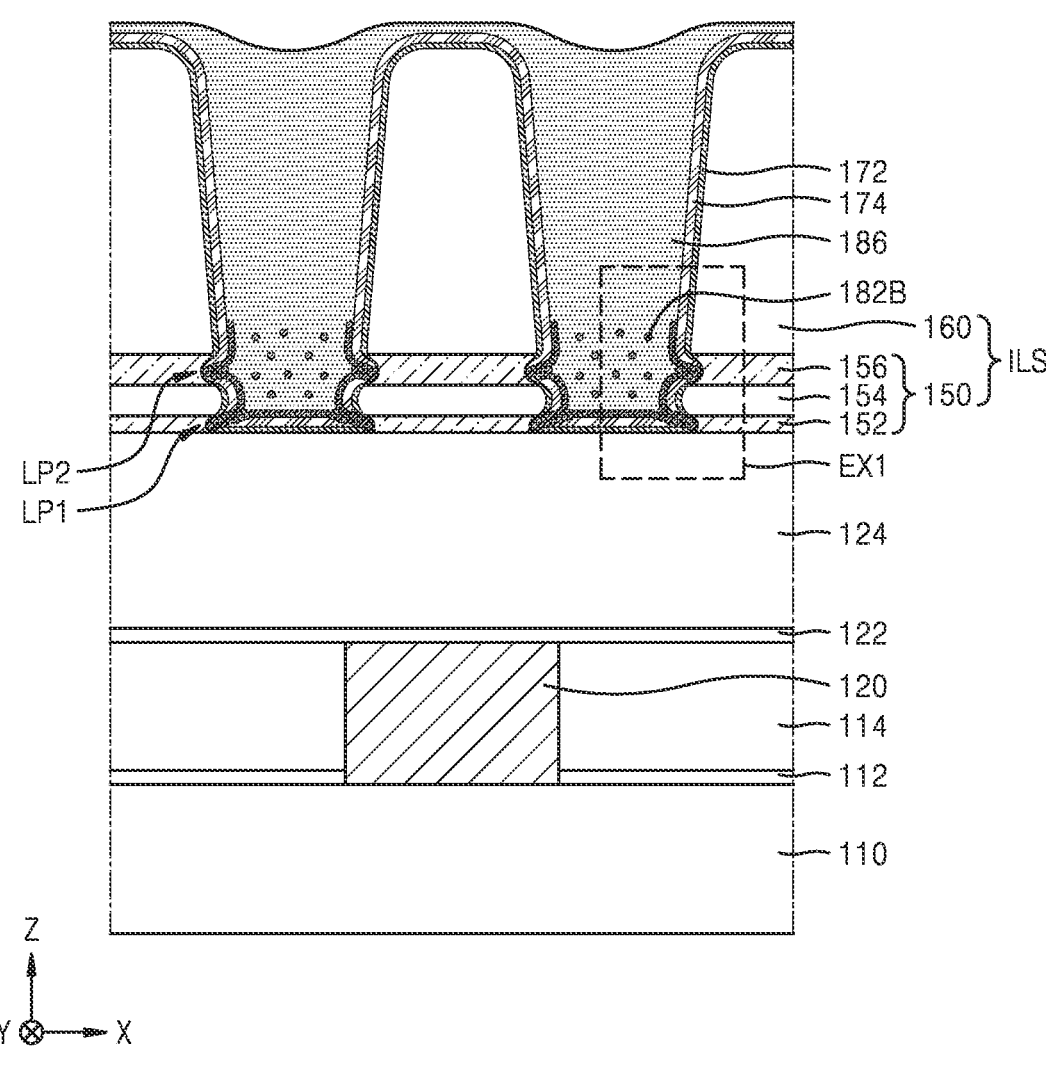
Figure 12B:
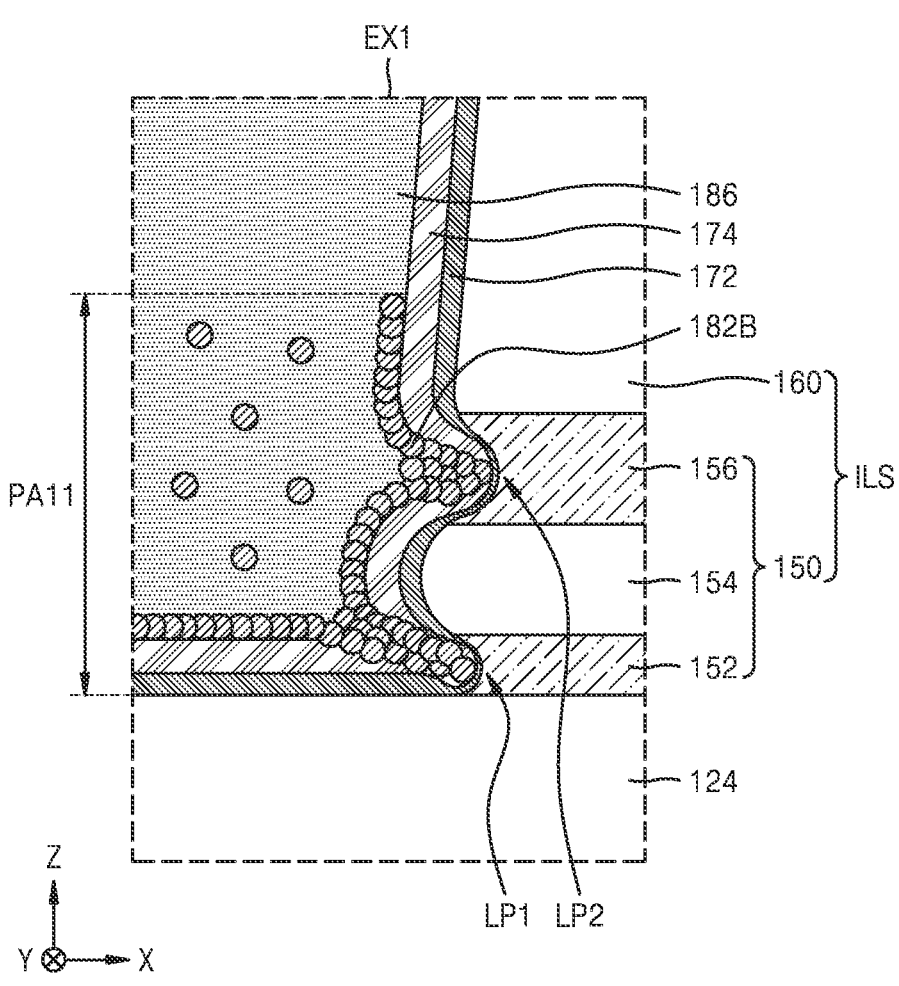

Referring to FIGS. 12A and 12B, a third local metal layer including a metal may be formed on a resultant structure shown in FIGS. 11A and 11B through a PVD process. The third local metal layer may include the same material as the first metal layer 182A. For example, the third local metal layer may include copper (Cu). The third local metal layer may not include the metal-containing particles 182B.

Thereafter, the third local metal layer may be reflowed by performing a heat treatment process or an annealing process on the resultant structure including the third local metal layer by a method similar to the method described with reference to FIGS. 10A and 10B. Owing to the reflow of the third local metal layer, the shape of the third local metal layer may be varied, and most of the third local metal layer may be on the second metal layer 184 (refer to FIGS. 11A and 11B) and fill the holes H1. While the third local metal layer is reflowed, some of the metal-containing particles 182B in the holes H1 may be further moved adjacent to the surface of the second conductive barrier layer 174 and may react with oxygen atoms permeating from the interlayer insulating layer 160 and/or the interlayer etch stop layer 150 through the first conductive barrier layer 172 and the second conductive barrier layer 174, thereby forming manganese oxide. In addition, owing to the reflow of the third local metal layer, the second metal layer 184 (refer to FIGS. 11A and 11B) and the third local metal layer may be integrally combined with each other, thereby forming metal plugs 186.

Figure 13:
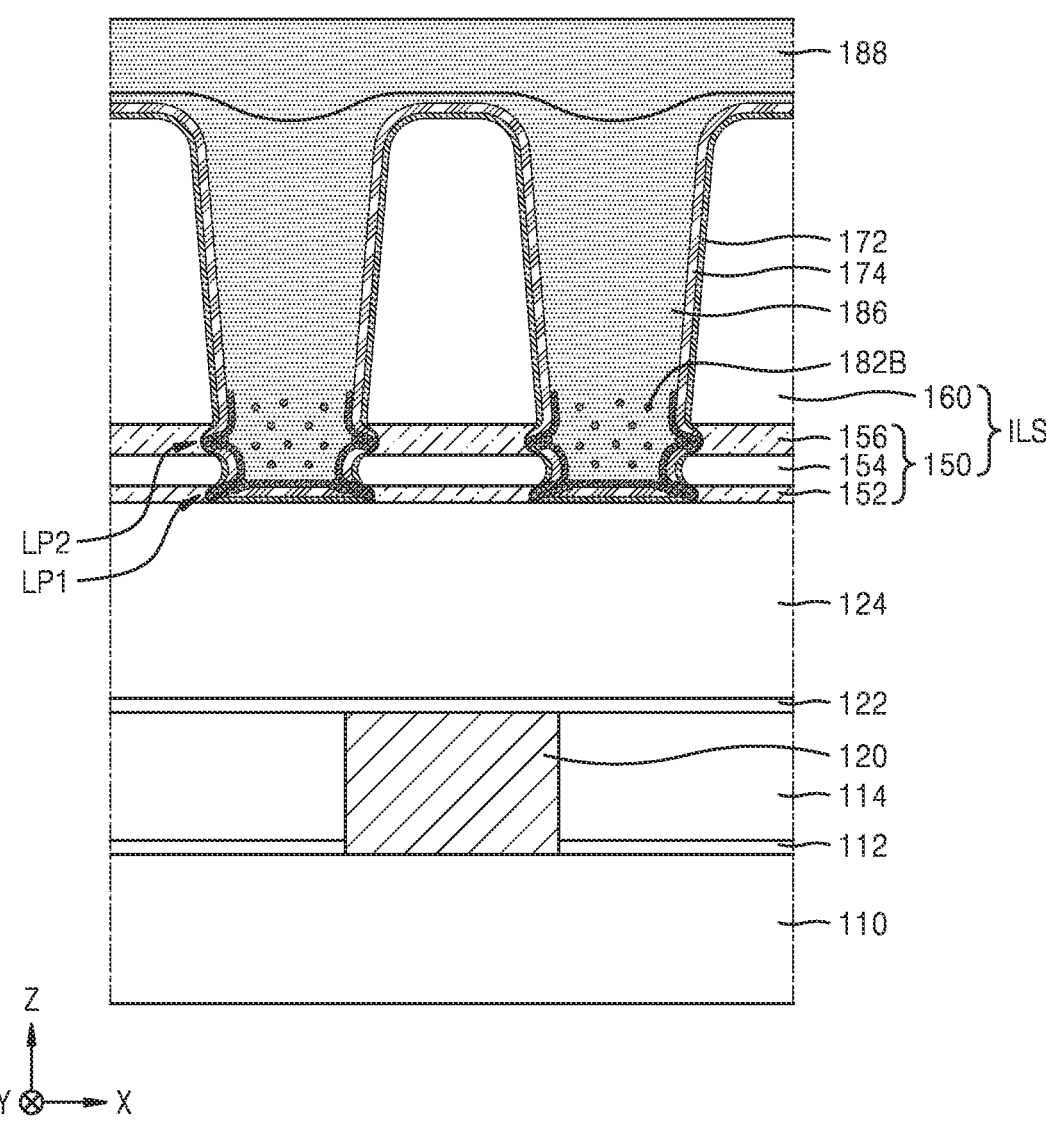

Referring to FIG. 13, a sacrificial metal layer 188 may be formed on a resultant structure including the metal plugs 186. The sacrificial metal layer 188 may include the same material as the material of the metal plugs 186. For example, the sacrificial metal layer 188 may include copper (Cu). The sacrificial metal layer 188 may be formed on the upper surface of the interlayer insulating layer 160 to cover the metal plugs 186 with a sufficient thickness. The sacrificial metal layer 188 may have a planarized upper surface. In embodiments, the sacrificial metal layer 188 may be formed through an electroplating process. Thereafter, a resultant structure on which the sacrificial metal layer 188 is formed may be annealed to grow metal grains included in the metal plugs 186.

Figure 14:
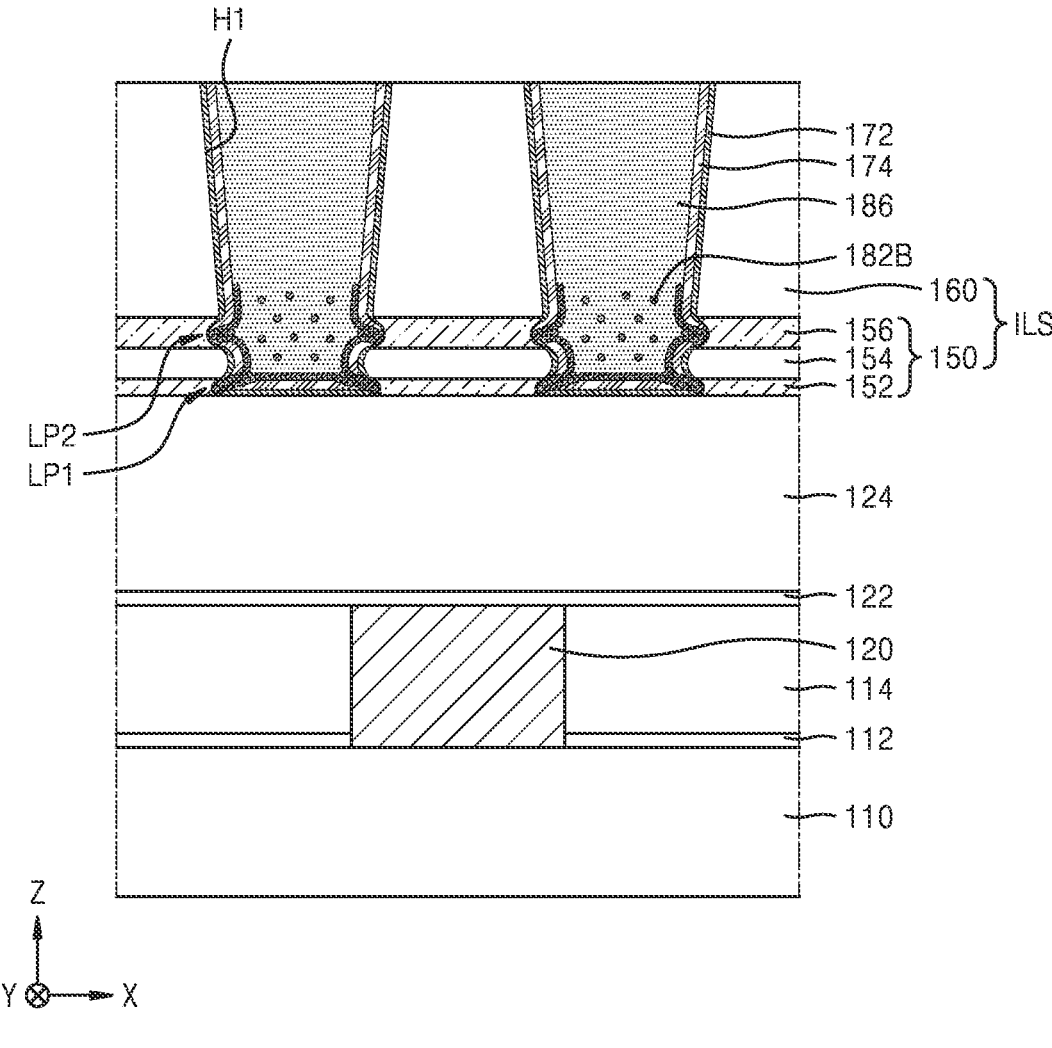

Referring to FIG. 14, a chemical mechanical polishing (CMP) process may be performed on a resultant structure shown in FIG. 13 to remove the sacrificial metal layer 188, portions of the metal plugs 186, and portions of each of the second conductive barrier layer 174 and the first conductive barrier layer 172 covering the upper surface of the interlayer insulating layer 160, thereby exposing the interlayer insulating layer 160.

Thereafter, a third conductive barrier layer 192 (refer to FIG. 1A) may be formed on a resultant structure shown in FIG. 14 to cover exposed upper surfaces of the metal plugs 186. In embodiments, a selective deposition process may be performed to form the third conductive barrier layer 192.

The third conductive barrier layer 192 may cover the entire upper surfaces of the metal plugs 186 and at least portions of upper surfaces of the first conductive barrier layer 172 and the second conductive barrier layer 174.

In embodiments, the second conductive barrier layer 174 and the third conductive barrier layer 192 may include the same material. In embodiments, the third conductive barrier layer 192 may include a Co layer or a Co alloy layer.

While the method of manufacturing the integrated circuit device 100 described with reference to FIGS. 1A and 1B has been described with reference to FIGS. 5 to 14 as an example method, it will be apparent to those of ordinary skill in the art that various modifications and changes may be made in the method described with reference to FIGS. 5 to 14 to manufacture the integrated circuit devices 200, 300, and 400 described with reference to FIGS. 2A to 4C, and other integrated circuit devices having structures modified or changed within the scope of the inventive concept.

While the inventive concept has been particularly shown and described with reference to embodiments thereof, it will be understood that various changes in form and details may be made therein without departing from the spirit and scope of the following claims.

The invention claimed is:

1. An integrated circuit device comprising:
an insulating structure above a substrate; and
an interconnection structure penetrating the insulating structure in a first direction and comprising a first local protrusion portion, the first local protrusion portion protruding outward in a second direction perpendicular to the first direction from a position adjacent to a lower surface of the insulating structure,
wherein the interconnection structure further comprises:
a metal plug comprising a first metal; and
a plurality of metal-containing particles comprising a second metal that is different from the first metal, wherein the plurality of metal-containing particles are irregularly dispersed in a lower plug region of the metal plug, the lower plug region being spaced apart from an upper surface of the metal plug and comprising the first local protrusion portion.

2. The integrated circuit device of claim 1, wherein an upper plug region of the metal plug, that is farther from the substrate than the lower plug region of the metal plug is from the substrate, does not include the plurality of metal-containing particles.

3. The integrated circuit device of claim 1, wherein the interconnection structure further comprises: a first conductive barrier layer comprising a conductive metal nitride and covering a lower surface and a sidewall of the metal plug; and
a second conductive barrier layer comprising a third metal that is different from the first metal and the second metal, wherein the second conductive barrier layer is between the lower surface of the metal plug and the first conductive barrier layer and between the sidewall of the metal plug and the first conductive barrier layer,
wherein the first conductive barrier layer has a variable thickness, and a thickness of a first portion of the first conductive barrier layer on the first local protrusion portion is less than a thickness of a second portion of the first conductive barrier layer covering the lower plug region at a position farther from the substrate than the first local protrusion.

4. The integrated circuit device of claim 3, wherein the plurality of metal-containing particles comprise:

first dispersion particles located in the first local protrusion portion at positions adjacent to the second conductive barrier layer; and second dispersion particles dispersed at a location away from the second conductive barrier layer within the metal plug in the lower plug region of the metal plug at positions spaced apart from the first local protrusion portion, wherein the first dispersion particles comprise a metal oxide containing the second metal, the first dispersion particles including a material selected from MnO, $Mn_3O_4$, $Mn_2O_3$, $MnO_2$, $MnSi_xO_y$ (where x and y respectively refer to arbitrary natural numbers) and the second dispersion particles comprise only the second metal.

5. The integrated circuit device of claim 1, wherein the insulating structure comprises: an aluminum (Al)-containing etch stop layer disposed at a position facing the first local protrusion portion in the second direction; and an interlayer insulating layer covering an upper surface of the aluminum (Al)-containing etch stop layer, wherein the aluminum (Al)-containing etch stop layer is in contact with the first local protrusion portion, and the interlayer insulating layer comprises a portion facing the lower plug region at a position farther from the substrate than the first local protrusion portion is from the substrate.

6. The integrated circuit device of claim 5, wherein the aluminum (Al)-containing etch stop layer comprises an aluminum oxide layer or an aluminum nitride layer.

7. The integrated circuit device of claim 1, wherein the interconnection structure further comprises a second local protrusion portion protruding outward in the second direction at a position farther from the substrate than the first local protrusion portion, and the second local protrusion portion is included in the lower plug region.

8. The integrated circuit device of claim 7, wherein the insulating structure comprises: a first aluminum (Al)-containing etch stop layer that is in contact with the first local protrusion portion; a SiOC layer covering an upper surface of the first aluminum (Al)-containing etch stop layer; a second aluminum (Al)-containing etch stop layer covering an upper surface of the SiOC layer and being in contact with the second local protrusion portion; and an interlayer insulating layer covering an upper surface of the second aluminum (Al)-containing etch stop layer, wherein the interlayer insulating layer comprises a portion facing the lower plug region at a position farther from the substrate than the second local protrusion portion.

9. The integrated circuit device of claim 1, wherein the first metal is copper (Cu), and the second metal is manganese (Mn).

10. The integrated circuit device of claim 1, wherein the interconnection structure further comprises:

a first conductive barrier layer comprising a conductive metal nitride and covering a lower surface and a sidewall of the metal plug;

a second conductive barrier layer comprising a third metal that is different from the first metal and the second metal, wherein the second conductive barrier layer is between the lower surface of the metal plug and the first conductive barrier layer and between the sidewall of the metal plug and the first conductive barrier layer; and a third conductive barrier layer comprising the third metal and covering an upper surface of the metal plug.

11. An integrated circuit device comprising:

an insulating structure comprising an interlayer etch stop layer having a multi-layer structure disposed above a substrate and an interlayer insulating layer covering the interlayer etch stop layer; and an interconnection structure penetrating the interlayer etch stop layer and the interlayer insulating layer in a vertical direction and comprising first and second local protrusion portions, wherein the first and second local protrusion portions protrude outward in a horizontal direction from positions adjacent to the interlayer etch stop layer and are spaced apart from each other in the vertical direction, wherein the interconnection structure further comprises:

a metal plug comprising a first metal; and a plurality of metal-containing particles comprising a second metal that is different from the first metal and being irregularly dispersed in a lower plug region among lower and upper plug regions of the metal plug, the lower plug region being spaced apart from an upper surface of the metal plug and comprising the first and second local protrusion portions, the upper plug region being a remaining region of the metal plug other than the lower plug region.

12. The integrated circuit device of claim 11, wherein the upper plug region of the metal plug comprises a Cu layer, and the lower plug region of the metal plug comprises a Cu layer in which manganese (Mn) atoms and manganese oxide are dispersed.

13. The integrated circuit device of claim 11, wherein the etch stop layer comprises:

a first aluminum (Al)-containing etch stop layer disposed at a vertical level equal to a vertical level of the first local protrusion portion;

a SiOC layer covering an upper surface of the first aluminum (Al)-containing etch stop layer; and a second aluminum (Al)-containing etch stop layer covering an upper surface of the SiOC layer, the second aluminum (Al)-containing etch stop layer being at a vertical level equal to a vertical level of the second local protrusion portion.

14. The integrated circuit device of claim 11, wherein the interconnection structure further comprises:

a first conductive barrier layer comprising a conductive metal nitride and covering a lower surface and a sidewall of the metal plug; and a second conductive barrier layer comprising a third metal that is different from the first metal and the second metal, the second conductive barrier layer being between the lower surface of the metal plug and the first conductive barrier layer and between the sidewall of the metal plug and the first conductive barrier layer, wherein a portion of the first conductive barrier layer covering the sidewall of the metal plug has a variable thickness in the vertical direction, and a thickness of a portion of the first conductive barrier layer on at least one of the first local protrusion portion and the second local protrusion portion is less than a thickness of a portion of the first conductive barrier layer covering the lower surface of the metal plug.

15. The integrated circuit device of claim 14, wherein the plurality of metal-containing particles comprise:

first dispersion particles located in the first local protrusion portion and the second local protrusion portion at positions adjacent to the second conductive barrier layer; and second dispersion particles dispersed at a location away from the second conductive barrier layer within the metal plug in the lower plug region of the metal plug at positions spaced apart from the first local protrusion portion and the second local protrusion portion, wherein the first dispersion particles comprise a metal oxide containing the second metal, and the second dispersion particles comprise the second metal, and wherein the second dispersion particles are dispersed at a lower density than the first dispersion particles.

16. The integrated circuit device of claim 14, wherein the first metal is copper (Cu), the second metal is manganese (Mn), the third metal is cobalt (Co), and the conductive metal nitride is TaN.

17. The integrated circuit device of claim 11, further comprising:

a lower insulating layer between the substrate and the insulating structure; and a lower interconnection structure penetrating the lower insulating layer in the vertical direction and connected to the interconnection structure, wherein the lower interconnection structure comprises:

a lower metal plug comprising the first metal and not comprising the second metal; and a conductive barrier layer having a multi-layer structure surrounding the lower metal plug, wherein the conductive barrier layer comprises a TaN layer, a Co layer, or a combination thereof.

18. An integrated circuit device comprising:

a lower structure above a substrate;

an interlayer etch stop layer disposed on the lower structure and having a multi-layer structure comprising at least one aluminum (Al)-containing layer;

an interlayer insulating layer covering an upper surface of the interlayer etch stop layer; and an interconnection structure comprising at least one local protrusion portion that penetrates the interlayer etch stop layer and the interlayer insulating layer in a vertical direction and protrudes outward in a horizontal direction at a position adjacent to the at least one aluminum (Al)-containing layer, wherein the interconnection structure further comprises:

a metal plug comprising copper (Cu); and a plurality of dispersion particles comprising manganese (Mn) and irregularly dispersed in only a lower plug region of the metal plug, the lower plug region being spaced apart from an upper surface of the metal plug and comprising the at least one local protrusion portion.

19. The integrated circuit device of claim 18, wherein the etch stop layer comprises a first aluminum oxide layer, a SiOC layer, and a second aluminum oxide layer that are sequentially disposed on the lower structure, and the at least one local protrusion portion comprises a first local protrusion portion that is in contact with the first aluminum oxide layer and a second local protrusion portion that is in contact with the second aluminum oxide layer.

20. The integrated circuit device of claim 18, wherein the plurality of metal-containing particles comprise:

first dispersion particles located in the at least one local protrusion portion; and second dispersion particles dispersed in the lower plug region of the metal plug at positions spaced apart from the at least one local protrusion portion, wherein the first dispersion particles comprise manganese oxide including a material selected from $MnO$, $Mn_3O_4$, $Mn_2O_3$, $MnO_2$, $MnSi_xO_y$ (where x and y respectively refer to arbitrary natural numbers), and the second dispersion particles comprise manganese atoms, and wherein the second dispersion particles are dispersed at a lower density than the first dispersion particles.

\* \* \* \* \*